United States Patent
Gharia

(10) Patent No.: US 8,023,299 B1
(45) Date of Patent: Sep. 20, 2011

(54) CONTENT ADDRESSABLE MEMORY DEVICE HAVING SPIN TORQUE TRANSFER MEMORY CELLS

(75) Inventor: Nilesh A. Gharia, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 31 days.

(21) Appl. No.: 12/730,184

(22) Filed: Mar. 23, 2010

Related U.S. Application Data

(60) Provisional application No. 61/168,120, filed on Apr. 9, 2009.

(51) Int. Cl.
*G11C 15/00* (2006.01)
(52) U.S. Cl. .................. 365/49.1; 365/49.17; 365/49.18
(58) Field of Classification Search ................. 365/49.1, 365/49.17, 49.18
See application file for complete search history.

(56) References Cited

U.S. PATENT DOCUMENTS

| | | | |
|---|---|---|---|
| 6,154,384 A | 11/2000 | Nataraj et al. | |
| 6,304,477 B1 * | 10/2001 | Naji | 365/50 |
| 6,418,042 B1 | 7/2002 | Srinivasan et al. | |
| 6,757,779 B1 | 6/2004 | Nataraj et al. | |
| 6,760,241 B1 | 7/2004 | Gharia | |
| 6,845,026 B1 | 1/2005 | Gharia | |
| 6,961,810 B2 | 11/2005 | Srinivasan et al. | |
| 7,193,874 B1 | 3/2007 | Pereira et al. | |
| 7,289,356 B2 | 10/2007 | Diao et al. | |
| 7,499,303 B2 | 3/2009 | Lien et al. | |
| 2008/0084724 A1 * | 4/2008 | Nozieres et al. | 365/50 |
| 2008/0291720 A1 | 11/2008 | Wang et al. | |

* cited by examiner

*Primary Examiner* — Jason Lappas
(74) *Attorney, Agent, or Firm* — Mahamedi Paradice Kreisman LLP; William L. Paradice, III

(57) ABSTRACT

A CAM device includes an array of CAM cells each having a spin torque transfer (STT) storage cell to store a data bit. Each STT storage cell includes a first magnetic tunnel junction (MTJ) element coupled between a first input node and an output node of the CAM cell, a second MTJ element coupled between a second input node and the output node of the CAM cell, and a first match transistor coupled between the match line and ground potential and having a gate coupled to the output node. The logic state of the data bit is represented by the relative resistances of the first and second MTJ elements.

37 Claims, 23 Drawing Sheets

CONTENT ADDRESSABLE MEMORY DEVICE HAVING SPIN TORQUE TRANSFER MEMORY CELLS

CROSS-REFERENCE TO RELATED APPLICATIONS

This application claims the benefit under 35 USC 119(e) of the commonly owned U.S. Provisional Application No. 61/168,120 entitled "Spin Torque Transfer Content Addressable Memory Device" filed on Apr. 9, 2009, which is incorporated herein by reference.

TECHNICAL FIELD

The disclosure herein relates generally to content addressable memory (CAM) cells, and more specifically to spin torque transfer magnetic random access memory based CAM cells.

BACKGROUND

A content addressable memory (CAM) device is a storage device that is commonly used for high speed search operations because it can be instructed to compare a search key (e.g., a specific pattern of comparand data) with multiple data stored in an associated CAM array. A CAM array typically includes a plurality of rows of CAM cells, each of which can be accessed by a corresponding address for read and write operations. Binary CAM cells, which can store two states of information (e.g., a logic 1 and a logic 0), typically include a random access memory cell that stores data and includes a compare circuit that compares the stored data with a search key to generate a match result. During compare operations, the match results of the CAM rows are provided to a priority encoder via a plurality of corresponding match lines. In response to the match results, the priority encoder determines which matching CAM row has the highest priority associated with it, and outputs the index (e.g., address) of the highest priority match (HPM).

FIG. 1 illustrates a typical binary CAM cell. The CAM cell 100 includes a memory cell 110 and a compare circuit 120. In the example shown, the memory cell 110 is a static random access memory (SRAM) cell including a latch formed by cross-coupled inverters 112 and 114 and including access transistors 116 and 118. The latch stores a single bit of data (i.e. a logical one or zero) in a complementary manner (e.g., node 113 stores a data bit D and node 115 store the complemented data bit $\overline{D}$). Access transistor 116 couples node 113 to a bit line BL, and access transistor 118 couples node 115 to a complementary bit line $\overline{BL}$. The gates of access transistors 116 and 118 are connected to a word line WL, which upon being activated, enables data to be written to and/or read from the memory cell 110 via the bit lines BL and $\overline{BL}$. A pair of PMOS bit line pre-charge transistors 106 and 108 are connected between a supply voltage $V_{DD}$ and the bit lines BL and $\overline{BL}$, respectively, to pre-charge the bit lines for read and/or write operations in response to a read/write pre-charge signal PC_RW.

The compare circuit 120 includes four transistors 122, 124, 126, and 128. Transistors 122 and 124 are connected in series to form a first signal path between a match line ML and ground potential. The transistors 126 and 128 are connected in series to form a second signal path between the match line ML and ground potential. The gates of transistors 122 and 126 are connected to the data bit D and complementary data bit $\overline{D}$, respectively, stored in the memory cell 110. The gate of transistor 128 is connected to a compare line CL, while the gate of transistor 124 is connected to a complementary compare line $\overline{CL}$. The compare circuit 120 compares the data stored in the memory cell 110 with comparand data provided on compare lines CL and $\overline{CL}$, and indicates the match results of CAM cell 100 by selectively discharging the match line ML. Typically, the match line is pre-charged (e.g., to $V_{DD}$) prior to compare operations. Then, during compare operations, if the data stored in CAM cell 100 matches the comparand data, compare circuit 120 does not turn on and thus the match line ML remains in its pre-charged state to indicate the match condition. Conversely, if there is not a match, compare circuit 120 turns on and discharges the match line ML to ground potential to indicate the mismatch condition.

Existing CAM architectures are increasingly difficult to scale as device geometries continue to become smaller. More specifically, the difficulties of fabricating RAM cells below 45 nanometers limits the scalability of CAM devices that include such memory technologies. For example, referring to FIG. 1, as the die area of the SRAM cell 110 decreases so does the node capacitance between the inverters 112 and 114, which undesirably increases the susceptibility of nodes 113 and 115 to inadvertent logic changes (e.g., caused by single event upsets). As a result, the soft error rate of CAM cell 100 typically increases as device geometry decreases, thereby essential limiting the scalability of such CAM cells. DRAM-based CAM architectures suffer from similar restrictions, due to the amount of die area needed to maintain a given capacitance for storing charge.

Additionally, RAM-based CAM devices are volatile, and therefore must be continually powered to preserve data stored therein. The need for continual power undesirably restricts the application and durability of such RAM-based CAM devices.

Thus, it would be desirable to reduce the size and power consumption of a CAM cell, and to preserve the data stored in the CAM cell in the absence of power.

BRIEF DESCRIPTION OF THE DRAWINGS

The present embodiments are described herein by way of example, and not by way of limitation, in the figures of the accompanying drawings and in which like reference numerals refer to similar elements, as follows.

DETAILED DESCRIPTION

A CAM device having improved scalability is disclosed. In accordance with present embodiments, the CAM device includes CAM cells utilizing magnetic random access memory (MRAM) structures to store data for comparison with a search key (e.g., comparand data). MRAM structures are programmed to different states (e.g., logic 1 or logic 0) by varying the amount of current driven through the structures during program (e.g., write) operations. This is in contrast to flash memory and RAM-based memory structures that are programmed using charge accumulation.

For some embodiments, the CAM cell includes a spin torque transfer (STT) memory cell to store data. More specifically, for STT memory cells, data is stored on one or more magnetic tunnel junction (MTJ) elements as a function of magnetic polarities. The magnetization of the MTJ elements is not dependent upon electric charge, thereby allowing the STT memory cells to store data even when power is interrupted or removed. Further, overall power consumption of STT-CAM cells of the present embodiments is reduced compared to conventional CAM devices (e.g., that utilize SRAM cells or DRAM cells for data storage) because the current used to read, write, and/or compare data in the STT cells is relatively small compared to the current used to read, write, and/or compare data in such conventional CAM devices. In addition, the elements MTJ elements utilized in STT-CAM cells of the present embodiments can be formed on top of the semiconductor substrate, rather than within the substrate, thereby minimizing die area and thus allowing for improved scalability as compared to conventional SRAM and DRAM based CAM cells that employ transistors formed within the semiconductor substrate.

Figure 2A:
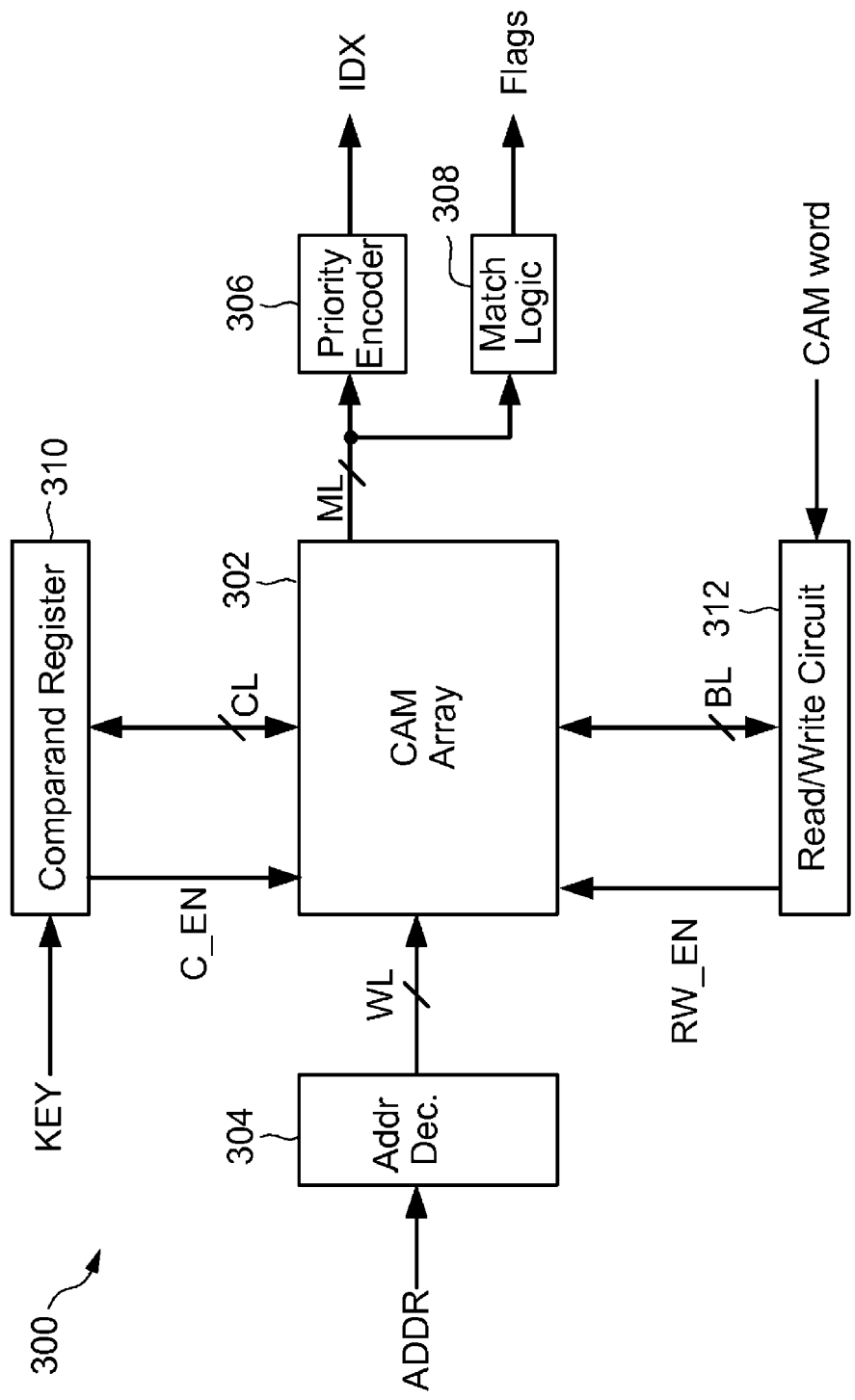
FIG. 2A shows a CAM device in accordance with the present embodiments.

FIG. 2A shows a CAM device 300 within which STT-CAM cells of present embodiments may be implemented. CAM device 300 includes a CAM array 302 that has any number of rows of CAM cells (not shown in FIG. 2A for simplicity). Each row of CAM cells may be used to store a corresponding data word. The CAM cells in CAM array 302 may be any suitable type of CAM cell such as, for example, synchronous CAM cells, asynchronous CAM cells, binary CAM cells, ternary CAM cells, and/or quaternary CAM cells. CAM array 302 can be of any suitable size and/or configuration, and for some embodiments may include inter-row configurability features that allow storage of data words of varying lengths (e.g., words that are stored in more than one row and/or data words that are stored in a portion of a row), for example, as described in commonly owned U.S. Pat. Nos. 6,799,243 and 6,934,795, the entireties of which are incorporated herein by reference. Although not shown in FIG. 2A for simplicity, CAM array 302 may be divided into a plurality of separate, individually selectable CAM blocks, for example, as described in commonly owned U.S. Pat. Nos. 6,324,087, 6,687,785, and 6,763,425, the entireties of which are incorporated herein by reference.

Each row of CAM cells in CAM array 302 is coupled to an address decoder 304 via a corresponding word line (WL), and to a priority encoder 306 and to match logic 308 via a corresponding match line (ML). The word lines (WL) and match lines (ML) are represented collectively in FIG. 2A for simplicity. Address decoder 304 receives an address (ADDR) to select a row of CAM cells in CAM array 302 during read and write operations. The match lines provide match results for compare operations between the search key (KEY) and data stored in CAM array 302 to priority encoder 306, which in response thereto determines the matching entry that has the highest priority number associated with it and generates the index (IDX) or address of this highest priority match. Match logic 308 may generate a match flag to indicate a match condition, and may also generate a multiple match flag to indicate multiple matches.

Further, although not shown in FIG. 2A for simplicity, each row of CAM cells in array 302 may have one or more validity bits to indicate whether the corresponding row (or segment thereof) of CAM cells is in a valid state or an empty state. The validity bits may be provided to priority encoder 306 to generate the next free address (NFA) that is available in CAM array 302 for storing new data. The validity bits may also be provided to a well-known full flag logic circuit (not shown for simplicity) to generate a full flag and/or an empty flag for CAM array 302.

Each column of CAM cells in CAM array 302 is coupled to a comparand register 310 via comparand lines (CL) and to a read/write circuit 312 via bit lines (BL). Comparand register 310 provides the search key (KEY) to CAM array 302 for comparison with entries stored in CAM array 302 via the comparand lines CL, and includes an output to provide a compare enable signal (C_EN) to CAM array 302 to enable compare operations therein. Read/write circuit 312 includes well-known write drivers and sense amplifiers, and includes an I/O port to receive/output a CAM word, which can be written to and/or read from CAM array 302 via the bit lines BL in response to a read/write enable signal (RW_EN). Although not shown for simplicity, CAM device 300 may also include a global mask circuit that stores one or more mask patterns that selectively mask entries in CAM array 302 during compare operations with KEY.

Figure 2B:
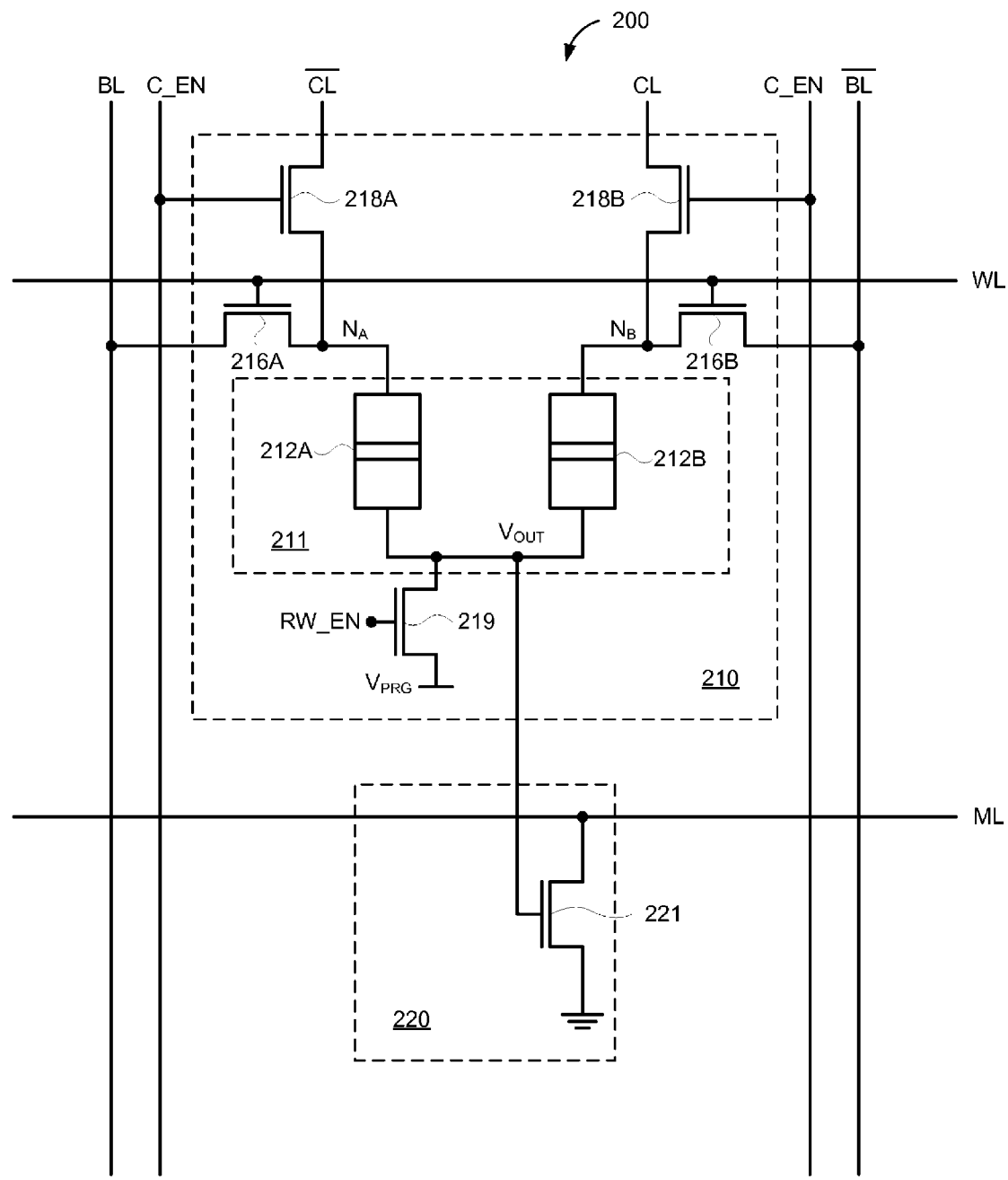
FIG. 2B shows a binary STT-CAM cell in accordance with some embodiments.

FIG. 2B illustrates a binary STT-CAM cell 200 in accordance with one embodiment of the present disclosure. The STT-CAM cell 200 includes an STT memory cell 210 and a compare circuit 220. The memory cell 210 includes a storage cell 211, access transistors 216A-216B, compare enable transistors 218A-218B, and a read/write enable transistor 219. The STT storage cell 211 includes two MTJ elements 212A-212B that together store a bit of data. The first MTJ element 212A is connected between a first input node $N_A$ and an output node $V_{OUT}$ of the STT storage cell 211, and the second MTJ element 212B is connected between a second input node $N_B$ and output node $V_{OUT}$. Access transistor 216A is connected between MTJ element 212A and bit line BL, and access transistor 216B is connected between MTJ element 212B and the complementary bit line $\overline{BL}$. The gates of access transistors 216A and 216B are connected to a word line WL. When asserted (e.g., to logic high), the word line WL turns on access transistors 216 to allow data to be written to and/or read from the STT storage cell 211 via the bit lines BL and $\overline{BL}$. When de-asserted (e.g., to logic low), the word line WL turns off access transistors 216 to isolate STT storage cell 211 from the bit lines.

The read/write enable transistor 219 is connected between the output node $V_{OUT}$ of the STT storage cell 211 and an adjustable program voltage $V_{PRG}$, and has a gate coupled to the read/write signal line RW_EN. The signal RW_EN is driven to a logic high state during read and write operations to couple output node $V_{OUT}$ to $V_{PRG}$, and is driven to a logic low state during compare operations to isolate node $V_{OUT}$ from $V_{PRG}$. The adjustable program voltage $V_{PRG}$ can be set to any desired voltage to facilitate programming STT storage cell 211 to desired logic states and/or to implement read operations for STT storage cell 211.

The complementary compare line $\overline{CL}$ is connected to the first MTJ element 212A at node $N_A$ via the first compare enable transistor 218A, and the compare line CL is connected to the second MTJ element 212B at node $N_B$ via the second compare enable transistor 218B. The gates of the compare enable transistors 218A and 218B are connected to compare enable lines C_EN, which can be used to enable and disable compare operations for the STT-CAM cell 200. For simplicity, the compare lines CL and $\overline{CL}$ are shown as being connected only to the STT-CAM cell 200 shown in FIG. 2B. However, for embodiments including an array having a plurality of rows of STT-CAM cells 200, each pair of complementary compare lines CL and $\overline{CL}$ extends across the rows (i.e., along the columns) of the array and is coupled to a similarly positioned STT-CAM cell 200 in each row. In this manner, the complementary compare lines CL and $\overline{CL}$ can provide comparand data to all the CAM rows for concurrent comparison with all the data stored in the CAM rows.

The compare circuit 220 is coupled between STT memory cell 210 and the match line ML. For the exemplary embodiment of FIG. 2B, compare circuit 220 is implemented by an NMOS match transistor 221 coupled between the match line ML and ground potential, and having a gate coupled to the output node $V_{OUT}$ of the STT storage cell 211. In general, if data stored in STT storage cell 211 does not match the comparand data provided on the compare lines CL and $\overline{CL}$, match transistor 221 turns on and discharges the match line ML to ground potential to indicate the mismatch condition. Conversely, if data stored in STT storage cell 211 matches the comparand data, match transistor 221 remains off, and the match line ML remains in its charged state (e.g., VDD) to indicate the match condition.

As mentioned above, the STT storage cell 211 stores a data bit (D) in a differential manner according to the relative resistances RA and RB of MTJ elements 212A and 212B, respectively. More specifically, MTJ elements 212A and 212B form a programmable voltage divider circuit that generates an output voltage $V_{OUT}$ indicative of the logic state of the data bit stored therein, where $$Vout = VDD \frac{RA}{RA + RB}.$$

The magnitude of $V_{OUT}$ can be compared to a reference voltage ($V_{REF}$) to determine the logic state of D, for example, where $V_{OUT} < V_{REF}$ indicates D=0 and $V_{OUT} > V_{REF}$ indicates D=1.

For some embodiments, the STT storage cell 211 can be programmed to store D=0 by configuring MTJ element 212A to have a relatively low resistance (RA=RL) and configuring MTJ element 212B to have a relatively high resistance (RB=RH) so that the storage cell generates a relatively low value of $$Vout = VDD \frac{RL}{RL + RH} < V_{REF}.$$

Conversely, STT storage cell 211 can be programmed to store D=1 by configuring MTJ element 212A to have a relatively high resistance (RA=RH) and configuring MTJ element 212B to have a relatively low resistance (RB=RL) so that the storage cell generates a relatively high value of $$Vout = VDD \frac{RH}{RL + RH} > V_{REF}.$$

For exemplary embodiments described herein, VDD=1.2 volts, VH≈VDD, VL≈GND, RL≈3000Ω, and RH≈8000Ω. Thus, for such embodiments, configuring MTJ elements 212A-212B to store D=0 generates $$Vout = VDD \frac{RL}{RL + RH} \approx (1.2)\frac{8}{3+8} \approx 0.87$$

volts, and configuring MTJ elements 212A-212B to store D=1 generates $$Vout = VDD \frac{RH}{RL + RH} \approx (1.2)\frac{3}{3+8} \approx 0.33$$

volts. Of course, for other embodiments, other suitable values for VDD, VH, VH, RA, and RB may be used.

Figure 3A:
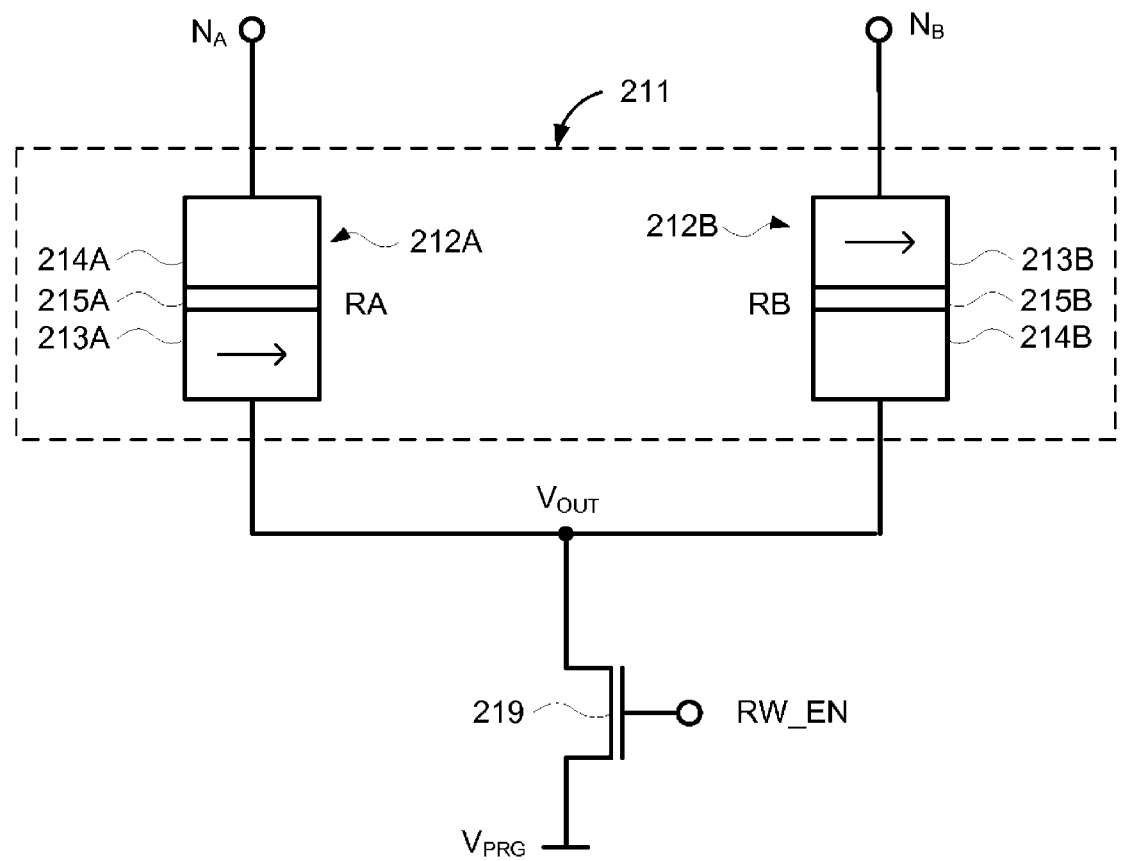
FIG. 3A shows an exemplary embodiment of the STT storage cell of the STT-CAM cell of FIG. 2B.

FIG. 3A shows one embodiment of the STT storage cell 211 in more detail. Each MTJ element 212 includes two ferromagnetic layers 213-214 separated by a thin layer of insulating material 215. Orienting the magnetization directions of the ferromagnetic layers 213-214 of an MJT element 212 in the same direction (e.g., to achieve parallel orientation) causes the MTJ element 212 to have a relatively low resistance RL, and conversely, orienting the magnetization directions of the ferromagnetic layers 213-214 of the MJT element 212 to opposite directions (e.g., to achieve anti-parallel orientation) causes the MTJ element 212 to have a relatively high resistance RH, wherein RH>RL.

For exemplary embodiments described herein, the magnetization direction of the first ferromagnetic layer 213 of each MTJ element 212 is fixed to a predetermined magnetization direction that does not generally change, and thus the first ferromagnetic layer 213 of each MTJ element 212 is denoted as the fixed or pinned layer (e.g., as indicated by the arrows associated with layers 213A and 213B in FIG. 3A). The magnetization direction of the second ferromagnetic layer 214 of each MTJ element 212 is not fixed to a predetermined magnetization direction, but rather is free to change direction, and thus the second ferromagnetic layer 214 of each MTJ element 212 is denoted as the free layer (e.g., as indicated by the absence of arrows associated with layers 214A and 214B in FIG. 3A). During a program operation, the MTJ elements 212 can be programmed to a desired state via spin-torque transfer by driving a write current w across their ferromagnetic layers 213-214. More specifically, the free ferromagnetic layer 214 of each MTJ element 212 can be oriented to be parallel with its corresponding pinned ferromagnetic layer 213 (i.e. to achieve a relatively low resistance) by driving a current of a first polarity through the MTJ elements 212, and conversely, the free ferromagnetic layer 214 of each MTJ element 212 can be oriented to be anti-parallel with its corresponding pinned ferromagnetic layer 213 (i.e. to achieve a relatively high resistance) by driving a current of a second (e.g., opposite) polarity through the MTJ elements 212.

Figure 3B:
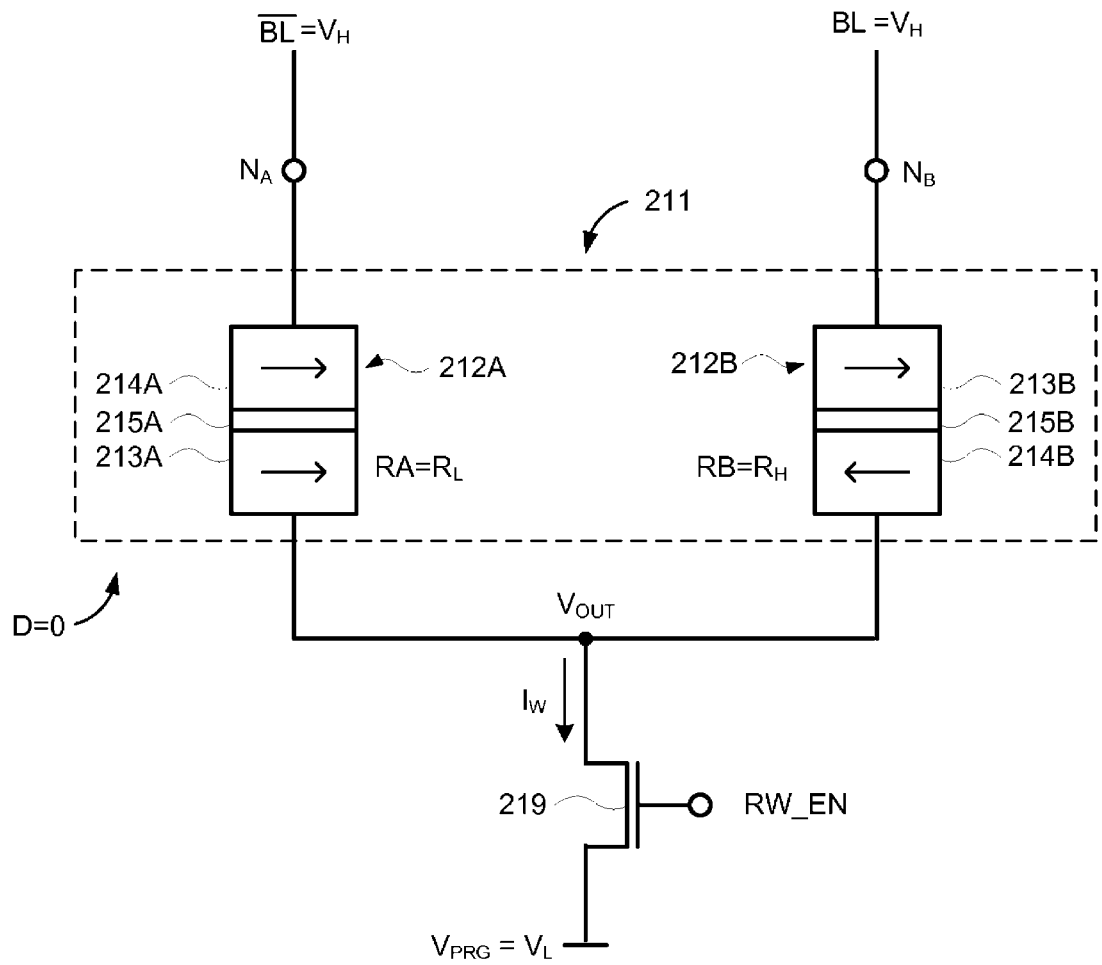
FIG. 3B shows the STT storage cell of FIG. 3A programmed to store a logic 0 data bit.
Figure 3C:
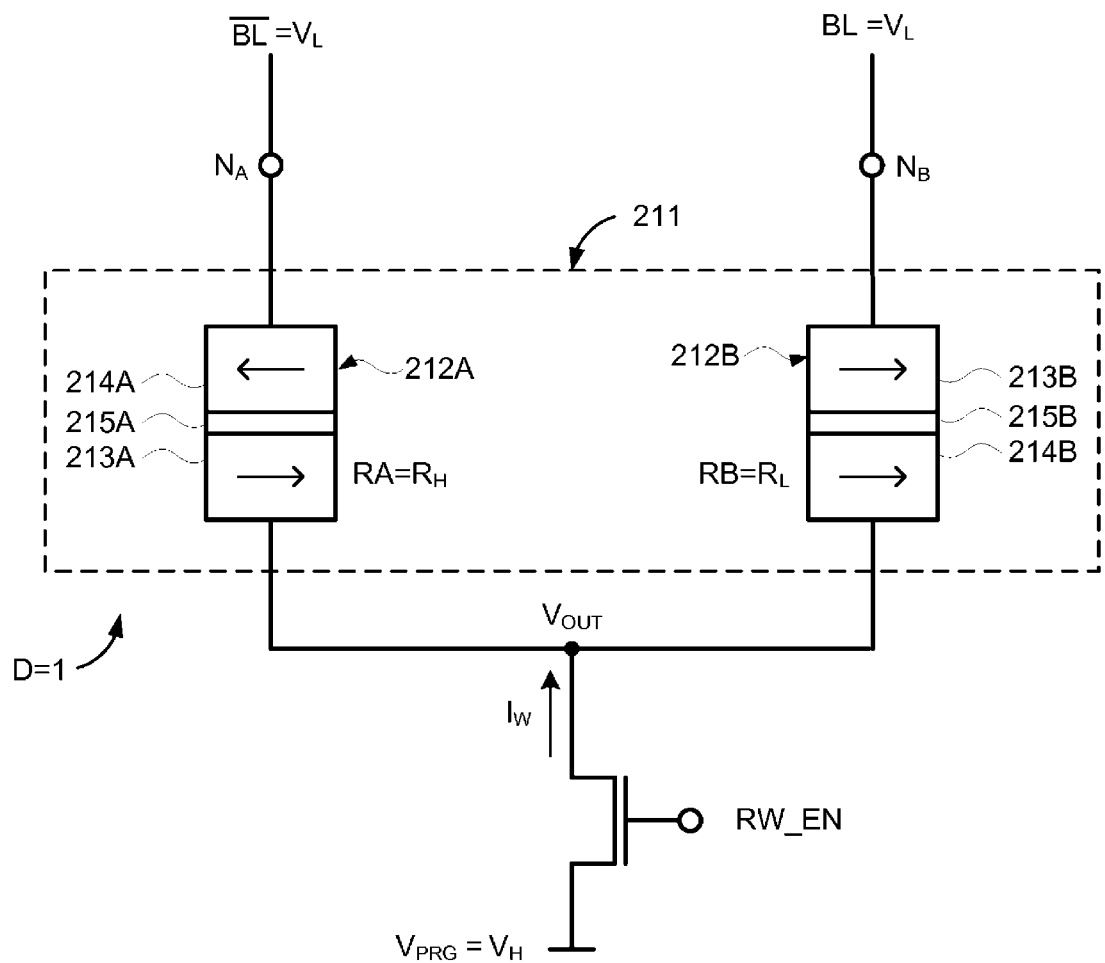
FIG. 3C shows the STT storage cell of FIG. 3A programmed to store a logic 1 data bit.

FIGS. 3B and 3C illustrate programming the STT storage cell 211 to a logic low state (D=0) and to a logic high state (D=1), respectively. Referring also to FIG. 2B, during program operations of STT-CAM cell 200, C_EN is driven low (e.g., to ground potential) to turn off the compare enable transistors 218 and thereby isolate MTJ elements 212A and 212B from the compare lines, the word line WL is asserted (e.g., to logic high) to turn on access transistors 216 to couple MTJ elements 212A and 212B to the bit lines, and R/W_EN is asserted (e.g., to logic high) to turn on R/W enable transistor 219 to couple MTJ elements 212A and 212B (and thus $V_{OUT}$) to the programmable voltage node $V_{PRG}$.

Referring to FIG. 3B, to store D=0 into the storage cell 211, the bit lines BL and $\overline{BL}$ are driven to a high voltage VH (e.g., to VDD), and the program voltage $V_{PRG}$ is driven to a low voltage VL (e.g., to VSS or ground potential). In response thereto, a write current $I_W$ is sourced from VDD via the bit lines BL and $\overline{BL}$ through MTJ elements 212A-212B and the R/W enable transistor 219 toward ground potential at $V_{PRG}$. The write current $I_W$ driven across MTJ element 212A has a first polarity that causes majority electrons flowing through the pinned layer 213A to be spin-polarized according to the magnetization direction of the pinned layer 213A. When these electrons subsequently reach the free layer 214A, their polarities cause the magnetization direction of the free layer 214A to become parallel to that of the pinned layer 213A (e.g., as depicted in FIG. 3B by the arrows associated with MTJ element 212A having the same direction).

The write current $I_W$ driven across MTJ element 212B has a first polarity that causes majority electrons flowing through free layer 214B to be spin-polarized according to the magnetization direction of the free layer 214B. However, some minority electrons retain spin polarities anti-parallel to the direction of magnetization of the free layer 214B, and the pinned layer 213B subsequently receives the majority electrons (i.e., those with spins parallel to the magnetization direction of the pinned layer 213B) and repels the minority electrons (i.e., those with spins anti-parallel to the magnetization direction of the pinned layer 213B). The repelled minority electrons are absorbed back into the free layer 214B, and cause the direction of magnetization of the free layer 214B to become anti-parallel to that of the pinned layer 213B (e.g., as depicted in FIG. 3B by the arrows associated with MTJ element 212B having opposite directions). Thus, by configuring MTJ element 212A to have a relatively low resistance RA=RL and configuring MTJ element 212B to have a relatively high resistance RB=RH, STT storage cell 211 stores a logic low data bit (D=0).

Referring to FIG. 3C, to store D=1 into the storage cell 211, the bit lines BL and $\overline{BL}$ are driven to the low voltage VL, and the program voltage $V_{PRG}$ is driven to the high voltage VH. In response thereto, a write current $I_W$ is sourced from $V_{PRG}$ via R/W enable transistor 219 through MTJ elements 212A and 212B toward VSS via bit lines BL and $\overline{BL}$, respectively. The reverse write current $I_W$ driven across MTJ element 212B has a second polarity that causes majority electrons flowing through the pinned layer 213BA to be spin-polarized according to the magnetization direction of the pinned layer 213B. When these electrons subsequently reach the free layer 214B, their polarities cause the magnetization direction of the free layer 214B to become parallel to that of the pinned layer 213B (e.g., as depicted in FIG. 3C by the arrows associated with MTJ element 212B having the same direction).

The reverse write current $I_W$ driven across MTJ element 212B causes majority electrons flowing through free layer 214A to be spin-polarized according to the magnetization direction of the free layer 214A. However, some minority electrons retain spin polarities anti-parallel to the direction of magnetization of the free layer 214A. The pinned layer 213A subsequently receives the majority electrons (i.e., those with spins parallel to the magnetization direction of the pinned layer 213A) and repels the minority electrons (i.e., those with spins anti-parallel to the magnetization direction of the pinned layer 213A). The repelled minority electrons are absorbed back into the free layer 214A, and cause the direction of magnetization of the free layer 214A to become anti-parallel to that of the pinned layer 213A (e.g., as depicted in FIG. 3C by the arrows associated with MTJ element 212A having opposite directions). Thus, by configuring MTJ element 212A to have a relatively high resistance RA=RH and configuring MTJ element 212B to have a relatively low resistance RB=RL, STT storage cell 211 stores a logic high data bit (D=1).

STT-CAM cells in accordance with the present embodiments use less current (and thus less power) during write operations than conventional RAM-based CAM cells. For some embodiments fabricated using a 45 nanometer process, a write current $I_W$ of only approximately 221 µA is sufficient for programming MTJ elements 212 to an anti-parallel state (i.e., from a parallel state), and a write current $I_W$ of only approximately 153 µA is sufficient to program MTJ elements 212 to a parallel state (i.e., from an anti-parallel state).

Although the STT storage cell 211 advantageously consumes minimal power during program operations, the ability to re-orient the magnetization directions of the MTJ element's ferromagnetic layers 213-214 using a relatively small amount of current has prevented the use of STT storage cells in CAM cells because currents associated with compare operations in CAM devices typically results in unacceptable write disturb problems in the STT storage cells. More specifically, because comparand data is typically driven to all the CAM cells of a CAM array during compare each operation, the resulting current flow provided to each CAM cell during compare operations would inadvertently disturb (e.g., re-program to an unknown state) the data stored in a number of the CAM cells that employ STT storage cells. Indeed, write disturb problems in STT storage cells caused by the relatively large currents associated with CAM compare operations have precluded the use of STT storage cells as memory elements in CAM cells.

In accordance with the present embodiments, the STT-CAM cell 200 includes compare enable transistors 218 that limit the amount of current provided to the STT storage cell 211 during compare operations to prevent write disturb problems. For some embodiments, compare enable transistors 218 provide a compare current $I_C$ to STT storage cell 211 during compare operations that is less than the minimum write current $I_W$ necessary to change the orientations of the MTJ element's ferromagnetic layers 213-214, thereby preventing write disturb problems during compare operations. In addition, the relatively low compare current employed by the present embodiments minimizes power consumption during compare operations, as compared to conventional RAM-based CAM architectures.

Figure 4:
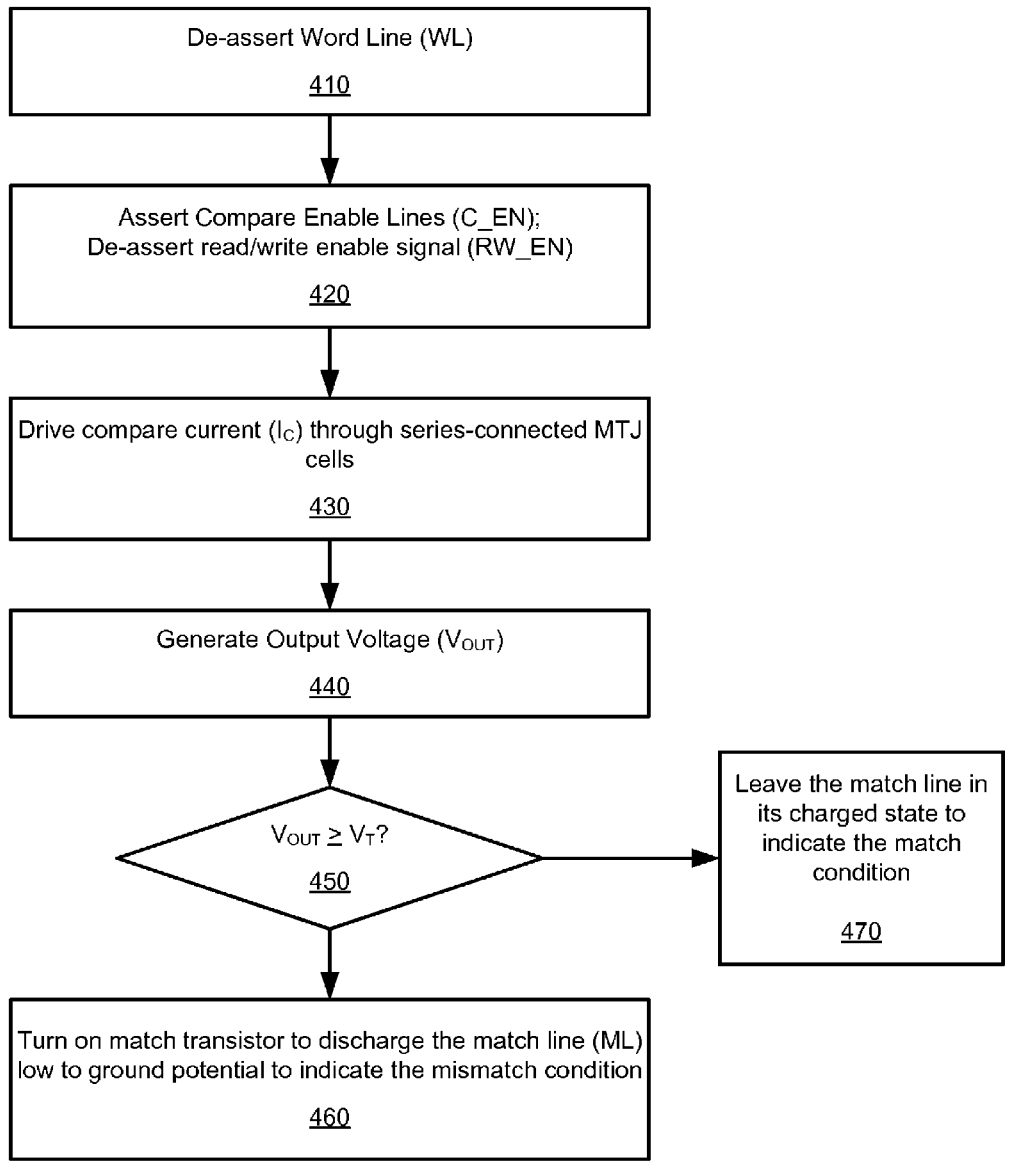
FIG. 4 is an illustrative flow chart depicting an exemplary compare operation for the STT-CAM cell of FIG. 2B.

FIG. 4 illustrates an exemplary compare operation for one embodiment of the binary STT-CAM cell 200 of FIG. 2B. First, the word line WL is de-asserted (e.g., to logic low) to turn off access transistors 216 and thereby isolate the storage cell 211 from bit lines BL and $\overline{BL}$, and the match line ML is pre-charged to a logic high state (e.g., to VDD) (410). De-coupling the STT storage cell 211 from the bit lines minimizes write disturb during the compare operation by preventing current from the bit lines from flowing through the MTJ elements 212. For some embodiments, multiple word lines may be de-activated in a CAM array during the compare operation so that the column of STT-CAM cells 200 connected to the same comparand line pair CL/$\overline{CL}$ are not susceptible to write disturb during compare operations.

Figure 5A:
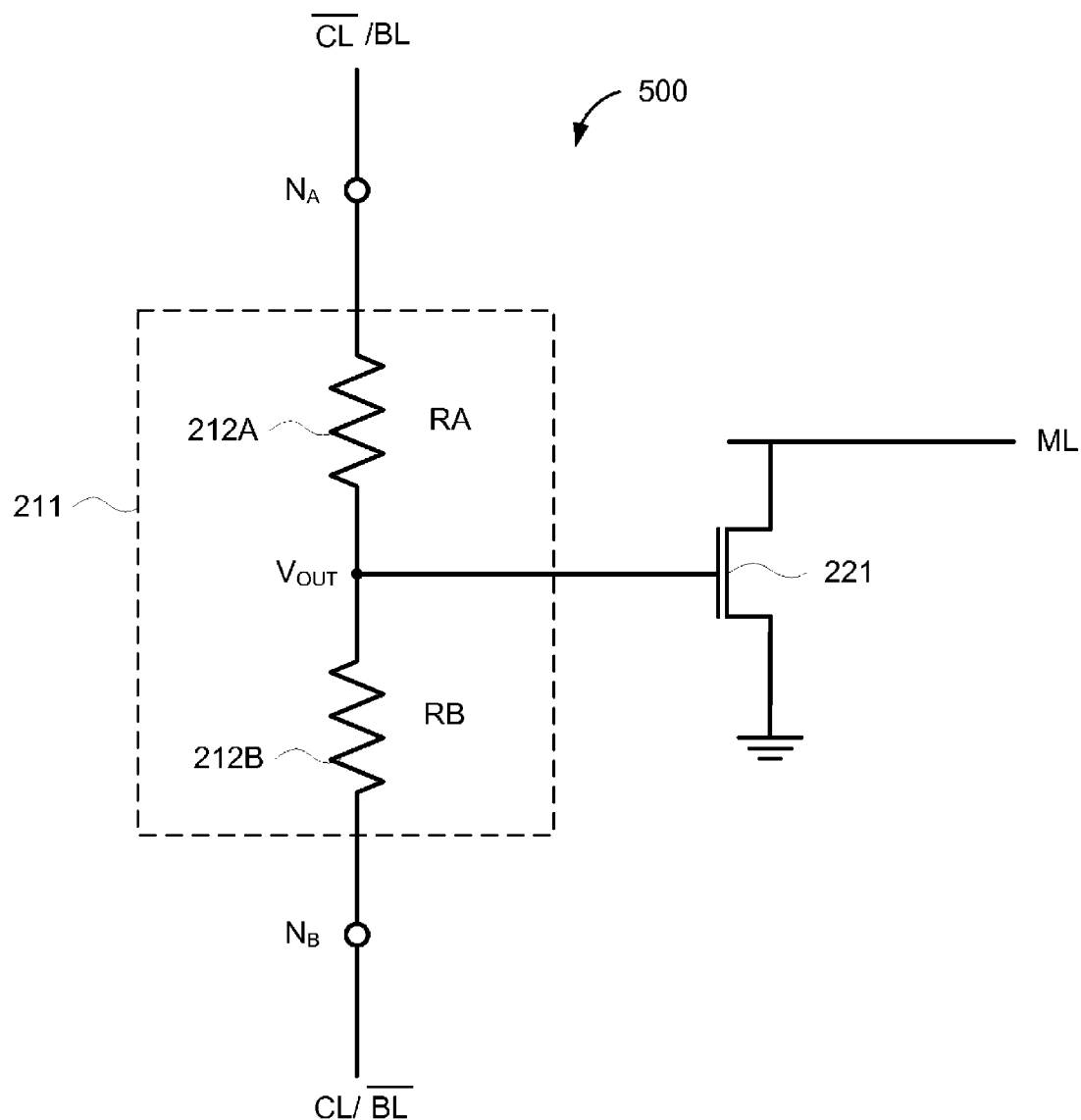
FIG. 5A depicts the binary STT-CAM cell of FIG. 2B as a voltage divider circuit according to one embodiment.

Then, the compare enable signal C_EN is asserted (e.g., to VDD), and the R/W enable signal RW_EN is de-asserted (e.g., to logic low) (420). Assertion of C_EN turns on compare enable transistors 218 and thereby couples the storage cell 211 to the compare lines CL and $\overline{CL}$. De-assertion of RW_EN turns off read/write transistor 219 and isolates storage cell 211 from $V_{PRG}$, thereby resulting in a series connection of MTJ elements 212A-212B between $\overline{CL}$ via node NA and CL via node NB, with the output node $V_{OUT}$ coupled to the gate of match transistor 221. In this configuration, MTJ elements 212A-212B form a programmable voltage divider circuit 500 that generates $$Vout = VDD \frac{RA}{RA + RB},$$

as depicted in FIG. 5A.

More specifically, STT-CAM cells of the present embodiments implement compare operations using a voltage divider circuit that generates the match results of the compare operation as a single match output voltage $V_{OUT}$, thereby allowing a single match transistor 221 to transfer the match results from the CAM cell to the match line ML. This is in contrast to conventional CAM cells such as CAM cell 100 of FIG. 1 that employ four transistors (e.g., compare circuit 120) to transfer the match result from the CAM cell to the match line ML as a differential voltage.

During compare operations, a comparand bit is provided to STT-CAM cell 200 by applying a differential voltage to the compare lines CL and $\overline{CL}$ to induce a compare current $I_C$ to flow through the MTJ elements 212A-212B (430). In accordance with present embodiments, the direction of the compare current $I_C$ flowing through the MTJ elements 212 is indicative of the logic state of the comparand bit, as described in more detail below. For some embodiments, the differential voltage applied to CL and $\overline{CL}$ may be adjusted so that the resulting compare current $I_c$ is less than the write current $I_W$ used during write operations to the STT-CAM cell 200, thereby preventing write disturb during compare operations.

The compare current $I_C$ provided through MTJ elements 212A-212B generates the match output voltage $V_{OUT}$ (440). In response thereto, match transistor 221 selectively turns on depending upon the magnitude of $V_{OUT}$ relative to its threshold voltage $V_T$ (450). Thus, if $V_{OUT} > V_T$, match transistor 221 turns on and discharges the match line ML (e.g., to ground potential) to indicate the mismatch condition (460). Conversely, if $V_{OUT} < V_T$, match transistor 221 remains off and the match line ML remains in its charged state (e.g., VDD) to indicate a match condition (470). For exemplary embodiments described herein, match transistor 211 has a threshold voltage $V_T \approx 0.5$ volts.

As mentioned above, the logic state of the comparand bit applied to the STT-CAM cell 200 during a compare operation is embodied by the direction or polarity of the compare current $I_C$ provided through the MTJ elements 212A and 212B during the compare operation. More specifically, for the exemplary embodiments described herein, a logic low comparand bit (C=0) is provided to the STT-CAM cell 200 by inducing a compare current $I_{C0}$ of a first direction to flow from node NA serially through MTJ element 212A and then through MTJ element 212B to node NB. The first compare current $I_{C0}$, which can be induced by driving $\overline{CL}$ to a high voltage (e.g., $\overline{CL}=VH$) and driving CL to a low voltage (CL=VL) to create a positive voltage differential between $\overline{CL}$ and CL, generates a value of $$Vout = (VH - VL)\frac{RA}{RA + RB}.$$

Conversely, a logic high comparand bit (C=1) is provided to the STT-CAM cell 200 by inducing a compare current $I_{C1}$ of a second direction to flow from node NB serially through MTJ element 212B and then through MTJ element 212A to node NA. The second compare current $I_{C1}$, which can be induced by driving $\overline{CL}$ to a low voltage (e.g., $\overline{CL}=VL$) and driving CL to a high voltage (CL=VH) to create a negative voltage differential between $\overline{CL}$ and CL, generates a value of $$Vout = (VH - VL)\frac{RB}{RA + RB}.$$

In this manner, the logic state of the comparand bit provided to the STT-CAM cell 200 during compare operations is determined by the polarity of the compare current $I_C$ flowing through the STT storage cell 211, which in turn determines the polarity of the voltage divider circuit when generating $V_{OUT}$. Thus, the logic state of the comparand bit can be changed by switching the direction of the compare current $I_C$.

Figure 5B:
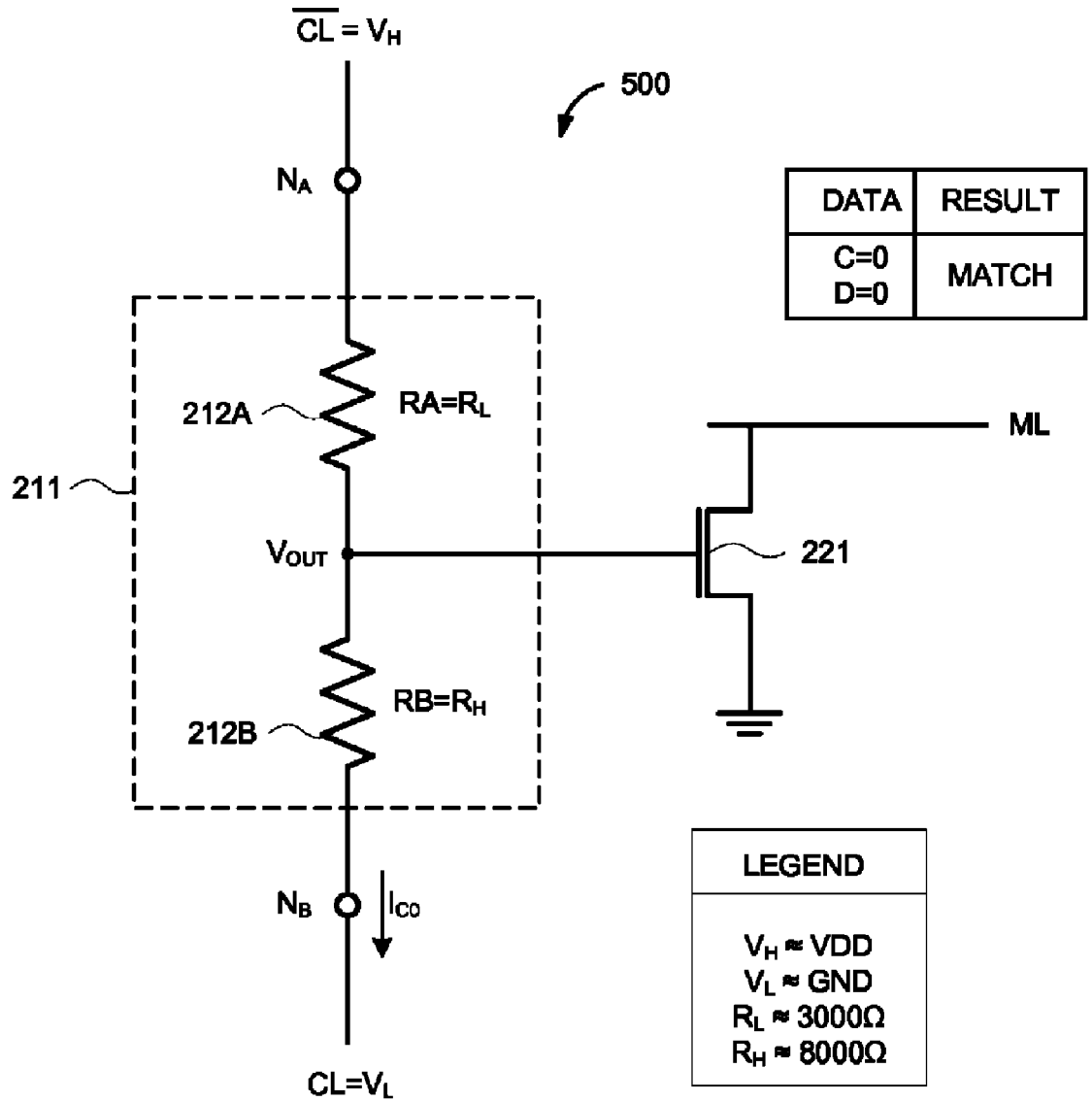
FIGS. 5B-5E depict compare operations between various stored data value and compare bits according to present embodiments.

FIG. 5B illustrates a compare operation between a logic low data bit (D=0) stored in the STT-CAM cell and a logic low compare bit (C=0). As described above, a logic 0 data bit is stored in STT storage cell 211 by configuring MTJ element 212A to have a relatively low resistance RL and by configuring MTJ element 212B to have a relatively high resistance RH, as shown in FIG. 5B. The logic low compare bit (C=0) is applied to STT storage cell 211 by driving $\overline{CL}$ high to VH and driving CL low to VL, which causes a compare current $I_{C0}$ to flow from node NA to node NB across MTJ elements 212A and 212B to generate an output voltage $$Vout = (VH - VL)\frac{RA}{RA + RB} \approx (1.2)(3k\Omega/11k\Omega) \approx 0.33$$

volts. Because $V_{OUT} < V_T$, match transistor 221 remains off and the match line ML remains in its charged (e.g., logic high) state to indicate the match condition.

Figure 5C:
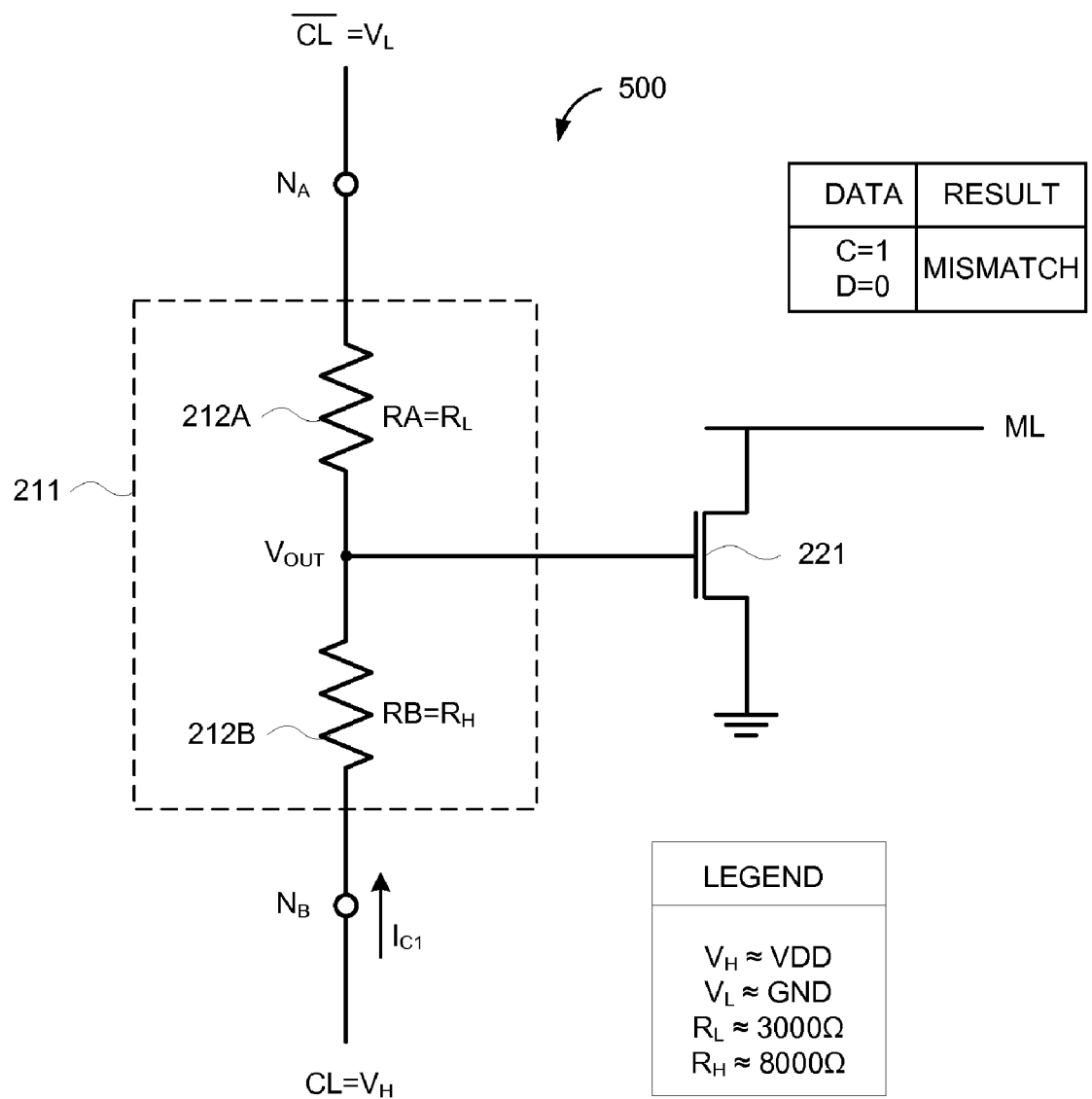

FIG. 5C illustrates a compare operation between a logic low data bit (D=0) stored in the STT-CAM cell and a logic high compare bit (C=1). The logic high compare bit (C=1) is applied to STT storage cell 211 by driving $\overline{CL}$ low to VL and driving CL high to VH, which causes a compare current $I_{C1}$ to flow from node NB to node NA across MTJ elements 212B and 212A. The STT memory cell's output voltage $V_{OUT}$ is given as $$Vout = (VH - VL)\frac{RB}{RA + RB} \approx (1.2)(8k\Omega/11k\Omega) \approx 0.87$$

volts. Because $V_{OUT} > V_T$, match transistor 221 turns on and discharges the match line ML (e.g., toward ground potential) to indicate the mismatch condition.

Figure 5D:
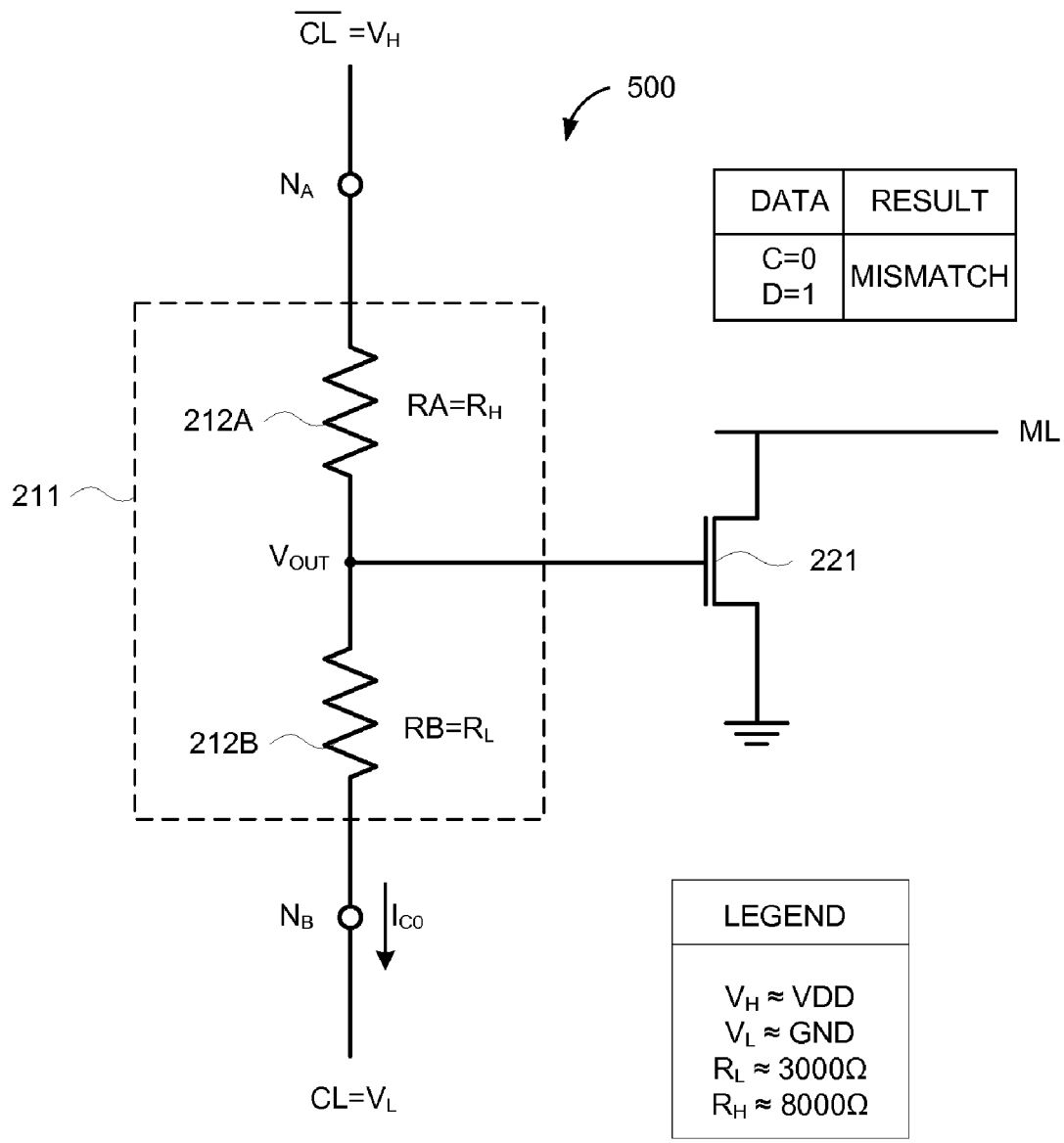

FIG. 5D illustrates a compare operation between a logic high data bit (D=1) stored in the STT-CAM cell and a logic low compare bit (C=0). As described above, the logic 1 data bit is stored in the STT-CAM cell by configuring MTJ element 212A to have a relatively high resistance RH and by configuring MTJ element 212B to have a relatively low resistance RL, as shown in FIG. 5D. The logic low compare bit (C=0) is applied to STT storage cell 211 by driving $\overline{CL}$ high to VH and driving CL low to VL, which causes a compare current $I_{C0}$ to flow from node NA to node NB across MTJ elements 212A and 212B to generate an output voltage $$Vout = (VH - VL)\frac{RA}{RA + RB} \approx (1.2)(8k\Omega/11k\Omega) \approx 0.87$$

volts. Because $V_{OUT} > V_T$, match transistor 221 turns on and discharges the match line ML (e.g., toward ground potential) to indicate the mismatch condition.

Figure 5E:
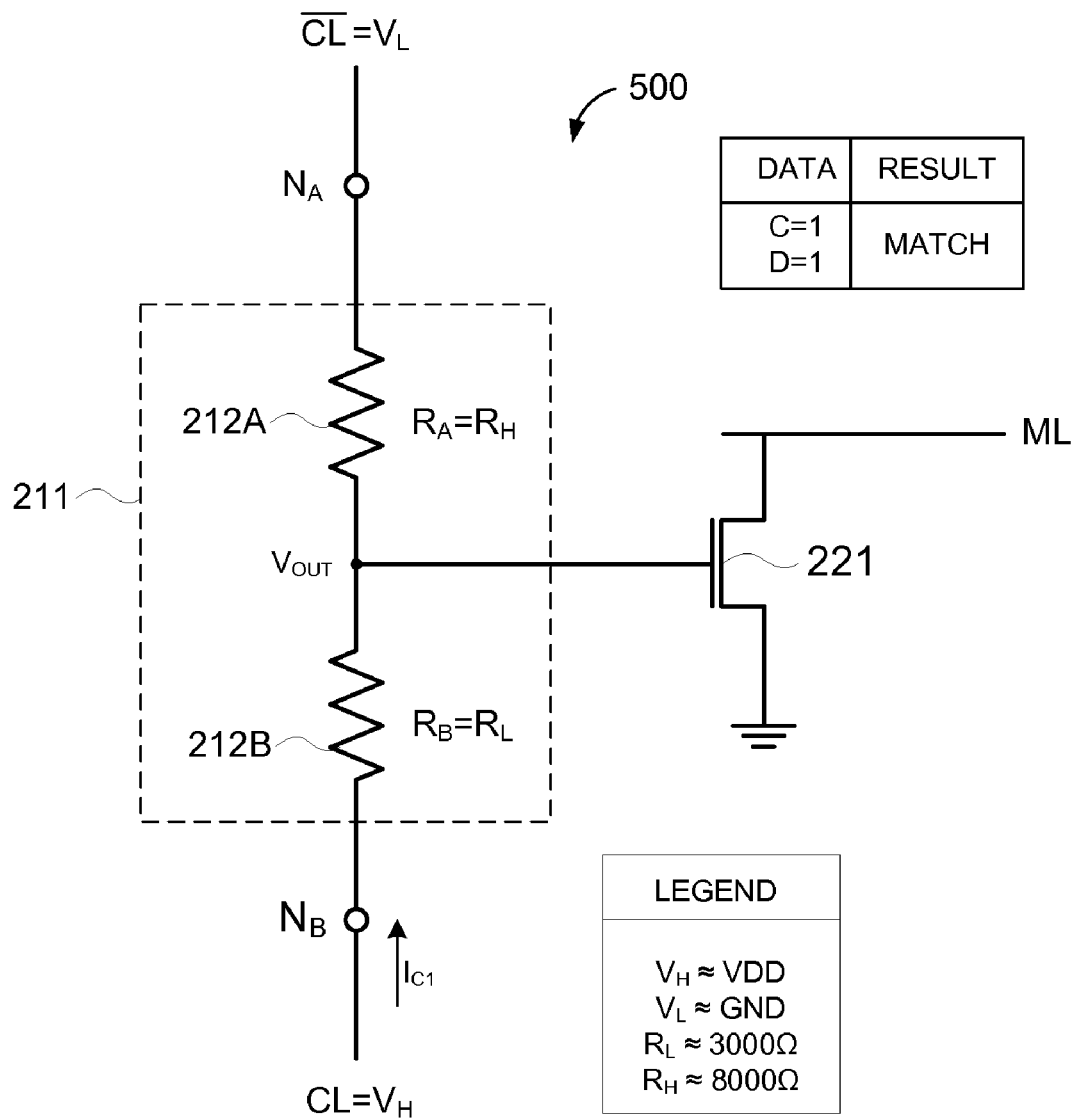

FIG. 5E illustrates a compare operation between a logic high data bit (D=1) stored in STT-CAM cell 400 and a logic high compare bit (C=1). The logic high compare bit (C=1) is applied to STT storage cell 211 by driving $\overline{CL}$ low to VL and driving CL high to VH, which causes a compare current $I_{C1}$ to flow from node NB to node NA across MTJ elements 212B and 212A. The STT memory cell's output voltage $V_{OUT}$ is given as $$Vout = (VH - VL)\frac{RB}{RA + RB} \approx (1.2)(3k\Omega/11k\Omega) \approx 0.33$$

volts. Because $V_{OUT} < V_T$, match transistor 221 remains off and match line ML remains in its charged state to indicate the match condition.

A complete listing of the match results for all combinations of the data bits and compare bits generated by the STT-CAM cell of the present embodiments is provided below in Table 1:

TABLE 1

| CMP Bit | $\overline{CL}$ | CL | Data Bit | MTJ 212A RA | MTJ 212A Spin | RB | MTJ 212B Spin | Match State |
|---|---|---|---|---|---|---|---|---|
| 0 | $V_H$ | $V_L$ | 0 | LOW | parallel | HIGH | anti-parallel | HIT |
| 1 | $V_L$ | $V_H$ | 0 | LOW | parallel | HIGH | anti-parallel | NO HIT |
| 0 | $V_H$ | $V_L$ | 1 | HIGH | anti-parallel | LOW | parallel | NO HIT |
| 1 | $V_L$ | $V_H$ | 1 | HIGH | anti-parallel | LOW | parallel | HIT |

As mentioned above, the compare enable transistors 218A and 218B are provided within the STT-CAM cell 200 to ensure that the compare current $I_C$ provided to MTJ elements 212 during compare operations does not disturb data stored in the STT memory cells 210. For some embodiments, the sizes (e.g., channel widths and/or lengths) of the compare enable transistors 218 are selected to be a predetermined fraction of the sizes of the access transistors 216 so that the compare current $I_C$ provided to MTJ elements 212 during compare operations is less than the minimum write current necessary to change the magnetization direction of the MTJ element's ferromagnetic layers 214. For other embodiments, the magnitude of the compare current $I_C$ is selected to be a predetermined fraction of the write current $I_W$ normally used to program data into the STT memory cells 210. In this manner, current associated with compare operations in the STT-CAM cell 200 will not disturb or otherwise upset data stored in the STT-CAM cell 200, thereby allowing STT-CAM cells in accordance with the present embodiments to be readily deployed in various CAM architectures to improve the scalability of CAM devices without sacrificing the reliability or data integrity.

In addition, the compare enable transistors 218A and 218B isolate the compare data from the STT memory cell 210 during read and write operations. Thus, for some embodiments, the compare enable lines C_EN are de-asserted during read and write operations (e.g., when the word line WL and the read/write enable signal RW_EN is asserted) to prevent additional current flow to the MTJ elements 212 via compare enable transistors 218A-218B. Conversely, the word line WL and the read/write enable signal RW_EN are de-asserted during compare operations (e.g., when the compare enable lines C_EN are asserted) to prevent additional current flow to the MTJ elements 212 from the complementary bit lines via access transistors 216A-216B.

In addition to increasing the scalability of CAM devices, the STT-CAM cells disclosed herein in accordance with the present embodiments occupy less silicon (e.g., substrate) area than conventional RAM-based CAM cells because the MTJ elements 212 of the STT cells 210 can be formed on top of the semiconductor substrate (e.g., rather than within the substrate), thereby conserving valuable die area for other circuits. For some embodiments, the MTJ elements 212 can be formed on top of the drain (or source) region of the read/write enable transistor 219. In this manner, present embodiments of the non-volatile, low power STT-CAM cell 200 can be implemented in silicon using only 6 transistors (see FIG. 2B). In addition, because all the transistors within STT-CAM cell 200 are NMOS transistors, dual wells are not required to house the STT-CAM cells 200.

Figure 1:
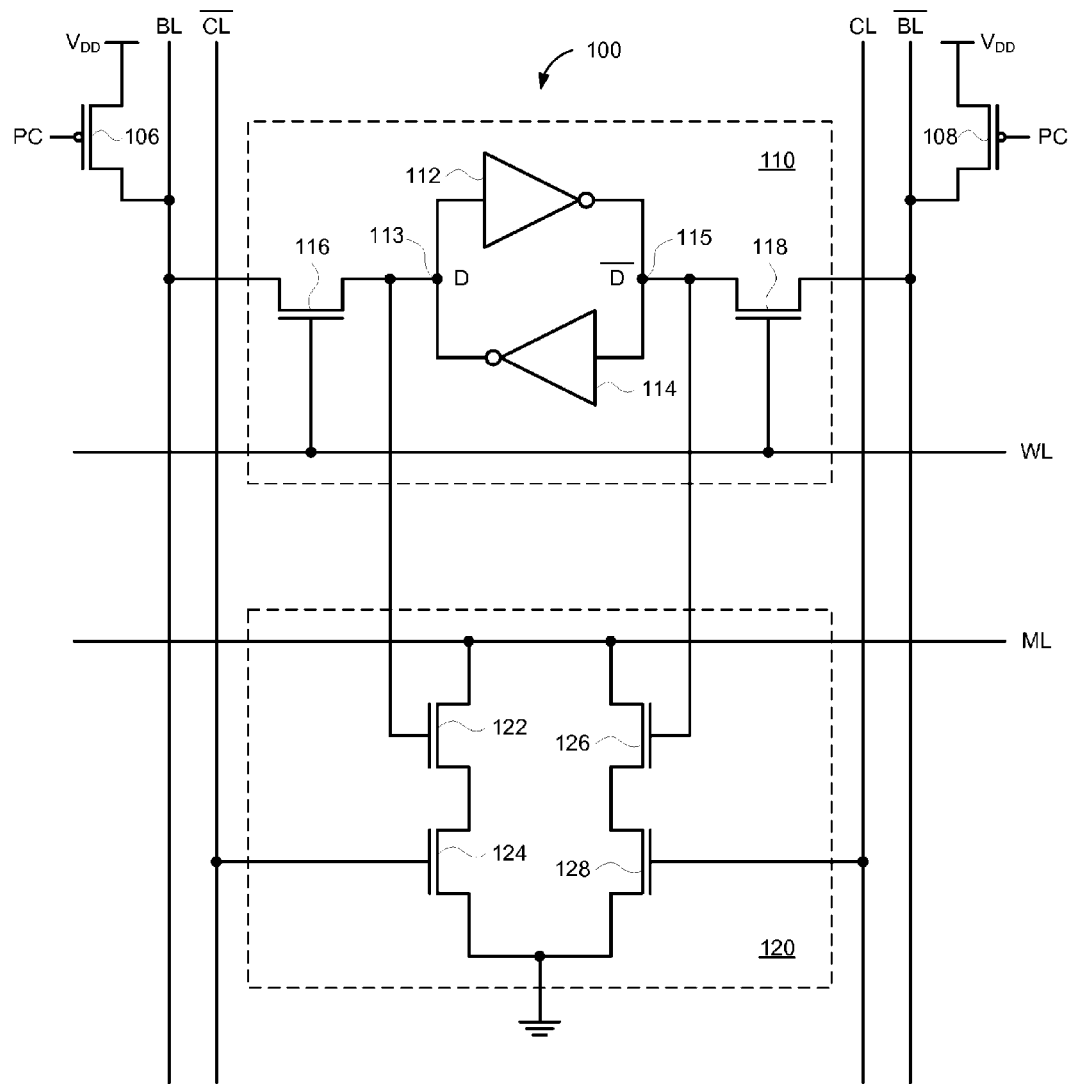
FIG. 1 shows a conventional SRAM-based binary CAM cell.

In contrast, the conventional SRAM-based CAM cell 100 of FIG. 1 requires the formation of 10 transistors in a semiconductor substrate, and is therefore larger than STT-CAM cells of the present embodiments. In addition, because the CMOS inverters 112 and 114 that form the SRAM cell of FIG. 1 include both NMOS and PMOS transistors, each conventional SRAM-based CAM cell 100 is typically formed using dual-well technology, which further limits its scalability. Further, conventional SRAM-based CAM cell 100 are volatile, and therefore cannot retain stored data if power is removed (e.g., which can be critical in portable and back-up systems).

In addition, because the STT-CAM cell 210 does not have any standby leakage current, a low $V_T$ MOSFET can be used as the match transistor 221, thereby increasing the speed with which match results are transferred from the CAM cell to the match lines. In contrast, conventional RAM-based CAM cells typically employ high $V_T$ MOSFETs that prevent standby leakage current, but also decrease speed. Further, while leakage is becoming increasingly problematic for SRAM and DRAM elements as device geometries continue to shrink, STT-CAM cells do not have leakage and therefore can be more easily migrated to smaller fabrication processes.

Referring again to FIG. 2B, during write operations to the STT-CAM cell 200, a write current $I_W$ is driven across both MTJ elements 212A-212B at the same time. Further, during compare operations, the read/write enable transistor 219 is turned off, and thus the compare current $I_C$ is driven through the series-connected the MTJ elements 212A-212B from one of the comparand lines CL/$\overline{CL}$ to the other comparand line CL/$\overline{CL}$. As a result, performing a compare operation during a write operation to STT-CAM cell 210 may undesirably alter (or corrupt) the intended program data, and therefore should be avoided.

Figure 6:
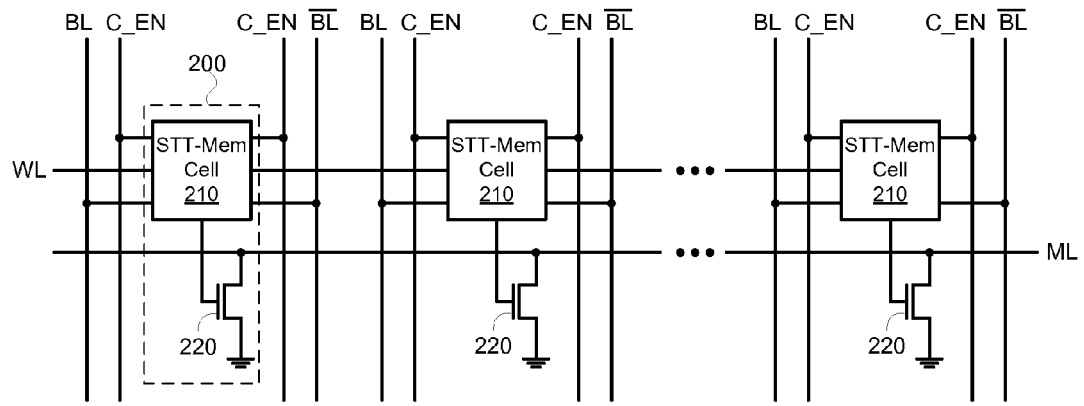
FIG. 6 shows a row of STT-CAM cells connected to a match line in accordance with one embodiment.

FIG. 6 illustrates a row of STT-CAM cells 200 connected to a match line, according to one embodiment. Each STT-CAM cell 200 includes STT memory cell 210 and match transistor 220. Each memory cell 210 is connected to a pair of bit lines BL/$\overline{BL}$ and compare enable lines C_EN, and the entire row of memory cells 210 are connected to a word line WL. Although not shown for simplicity, each of the memory cells 210 may additionally be connected to a pair of compare lines CL/$\overline{CL}$ and a read/write enable line RW_EN (e.g., as shown in FIG. 2B).

The match transistors 220 are connected to a match line ML in a NOR arrangement (e.g., in parallel). According to one embodiment, the match line ML is initially pre-charged to a logic high state (e.g., toward VDD). If the data stored in any of the cells 210 does not match the corresponding portion of the search key during a compare operation, the corresponding match transistor 220 turns on and discharges the match line ML to ground potential to indicate the mismatch (or "no hit") condition. Thus, the match line ML remains in its charged state to indicate a match (or "hit") condition only if the data stored in all of the memory cells 210 matches the applied search key or comparand data. Alternatively, the match line ML may be initially discharged to a ground potential, and subsequently raised to a voltage level VDD to the mismatch condition.

Figure 7:
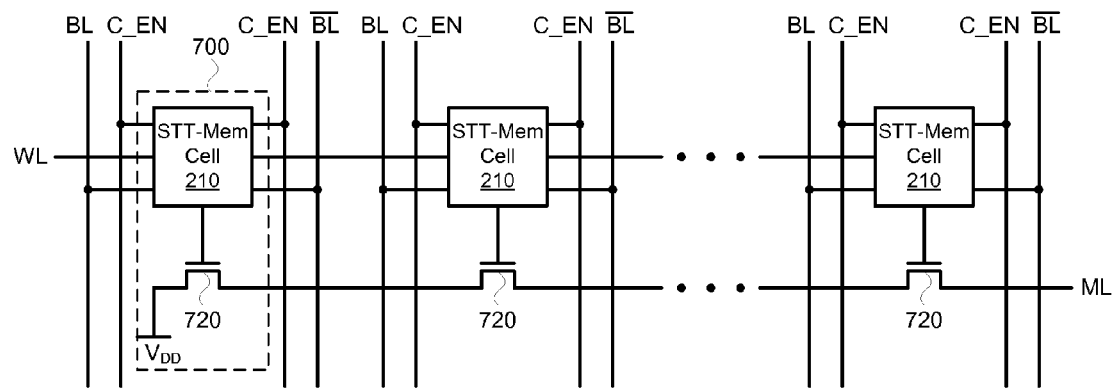
FIG. 7 shows a row of STT-CAM cells connected to a match line in accordance with another embodiment.

FIG. 7 illustrates a row of STT-CAM cells 700 connected to a match line ML according to another embodiment. Each STT-CAM cell 700 includes an STT memory cell 710 and a match transistor 720. Each memory cell 710 is connected to a pair of bit lines BL/$\overline{BL}$ and compare enable lines C_EN, and the row of memory cells 710 are connected to a word line WL. Although not shown for simplicity, each of the memory cells 710 may additionally be connected to a pair of compare lines CL/$\overline{CL}$ and a red/write enable line RW_EN (e.g., as shown in FIG. 2B).

The match transistors 720 are connected to a match line ML in a NAND arrangement (e.g., in series). According to one embodiment, the match line ML is initially discharged to a logic low mismatch state. If the data stored in any of the cells 710 does not match the corresponding portion of the search key during a compare operation, the corresponding match transistor 720 turns on. Thus, if all the CAM cells 700 in the row have match conditions, then all the match transistors 720 turn on and charge the match line high toward VDD to indicate the match condition. Conversely, if any of the CAM cells 700 indicates a mismatch condition, the corresponding match transistor 720 does not turn on, thereby causing the match line to remain in its discharged state to indicate the mismatch condition. Alternatively, the match line ML may be initially pre-charged to a high voltage potential, and subsequently discharged to a ground potential for a match condition.

It should also be noted that, in contrast to the embodiments described with respect to FIGS. 2-6, the STT-CAM cell 700 may be designed to enable the match transistor 720 to turn on when the data in the corresponding memory cell 710 matches a comparand data (i.e., a "hit" is determined when $V_{OUT}>V_T$). For example, this may be accomplished by reversing the compare line CL/$\overline{CL}$ configuration and/or the direction of the compare current $I_C$, to effect a reversal in corresponding comparand values. Thus, the possible match states for different combinations of the compare bit and the stored data bit during compare operations performed by the STT-CAM cell 700 are listed below in Table 2.

TABLE 2

| CMP Bit | $\overline{CL}$ | CL | Data Bit | RA | RB | Match State |
|---|---|---|---|---|---|---|
| 0 | $V_L$ | $V_H$ | 0 | LOW | HIGH | HIT |
| 1 | $V_H$ | $V_L$ | 0 | LOW | HIGH | NO HIT |
| 0 | $V_L$ | $V_H$ | 1 | HIGH | LOW | NO HIT |
| 1 | $V_H$ | $V_L$ | 1 | HIGH | LOW | HIT |

Figure 8:
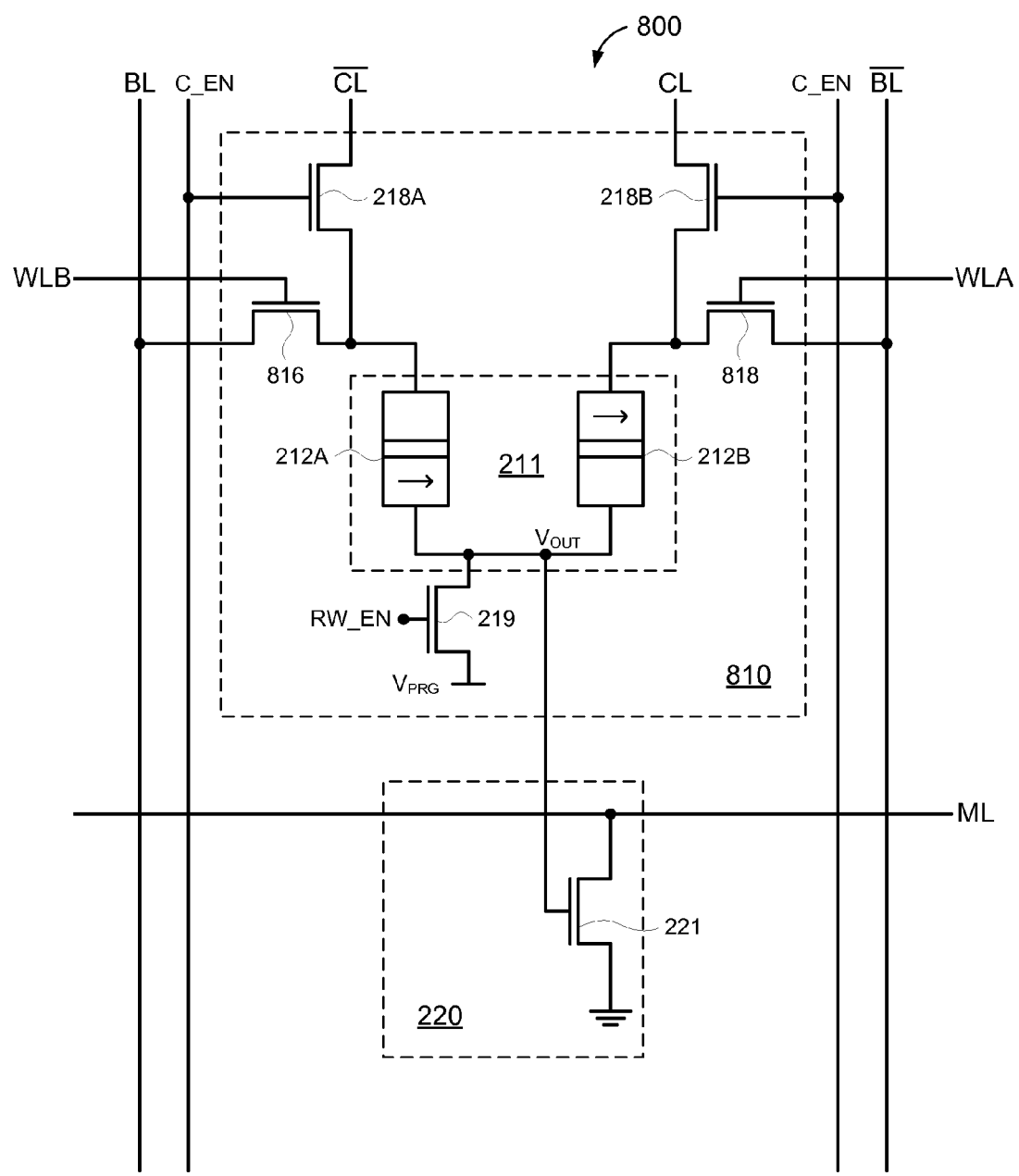
FIG. 8 shows a binary STT-CAM cell in accordance with other embodiments.

FIG. 8 illustrates a binary STT-CAM cell 800 in accordance with other embodiments. The STT-CAM cell 800 includes a memory cell 810 and compare circuit 220. The memory cell 810 is similar to the memory cell 210 of FIG. 2B, except that memory cell 810 is connected to two separate word lines WLA and WLB (i.e., as opposed to a single word line WL). More specifically, memory cell 810 includes two MTJ elements 212A and 212B connected to read/write enable transistor 219. The compare line CL is connected to the MTJ element 212B via compare enable transistor 218B, and the complementary compare line $\overline{CL}$ is connected to the MTJ element 212A via compare enable transistor 218A. The gates of transistors 218A-218B are connected to compare enable lines C_EN. For simplicity, the compare lines CL and $\overline{CL}$ are shown as being connected only to one memory cell STT-CAM cell 800. Of course, for actual embodiments, the compare lines CL and $\overline{CL}$ extend across multiple rows STT-CAM cells 800.

MTJ element 212A is connected to the bit line BL via access transistor 816, and MTJ element 212B is connected to the complementary bit line $\overline{BL}$ via access transistor 818. The gate of access transistor 816 is connected to a first word line WLA, and the gate of access transistor 818 is connected to a second word line WLB. Having separate word lines WLA and WLB for MTJ elements 212A and 212B, respectively, allows data to be written to the MTJ elements 212A and 212B independently of one another. For example, a data bit may be written to MTJ element 212A by activating word line WLA and driving a current from the read/write transistor 219 to the bit line BL (or vice-versa), while a data bit may be written to MTJ element 212B by activating word line WLB and driving a current from the read/write transistor 219 to the complementary bit line $\overline{BL}$ (or vice-versa). Compare operations are performed in STT-CAM cell 800 in a manner similar to that described above with respect to FIGS. 5A-5E. However, rather than deactivating a single word line WL prior to initiating a compare operation, both of the word lines WLB and WLA are deactivated.

The ability to independently program the MTJ elements 212A and 212B is advantageous because it ensures that a write current $I_{WA}$ used to program MTJ element 212A does not adversely affect a write current $I_{WB}$ used to program MTJ element 212B (and vice-versa).

Figure 9:
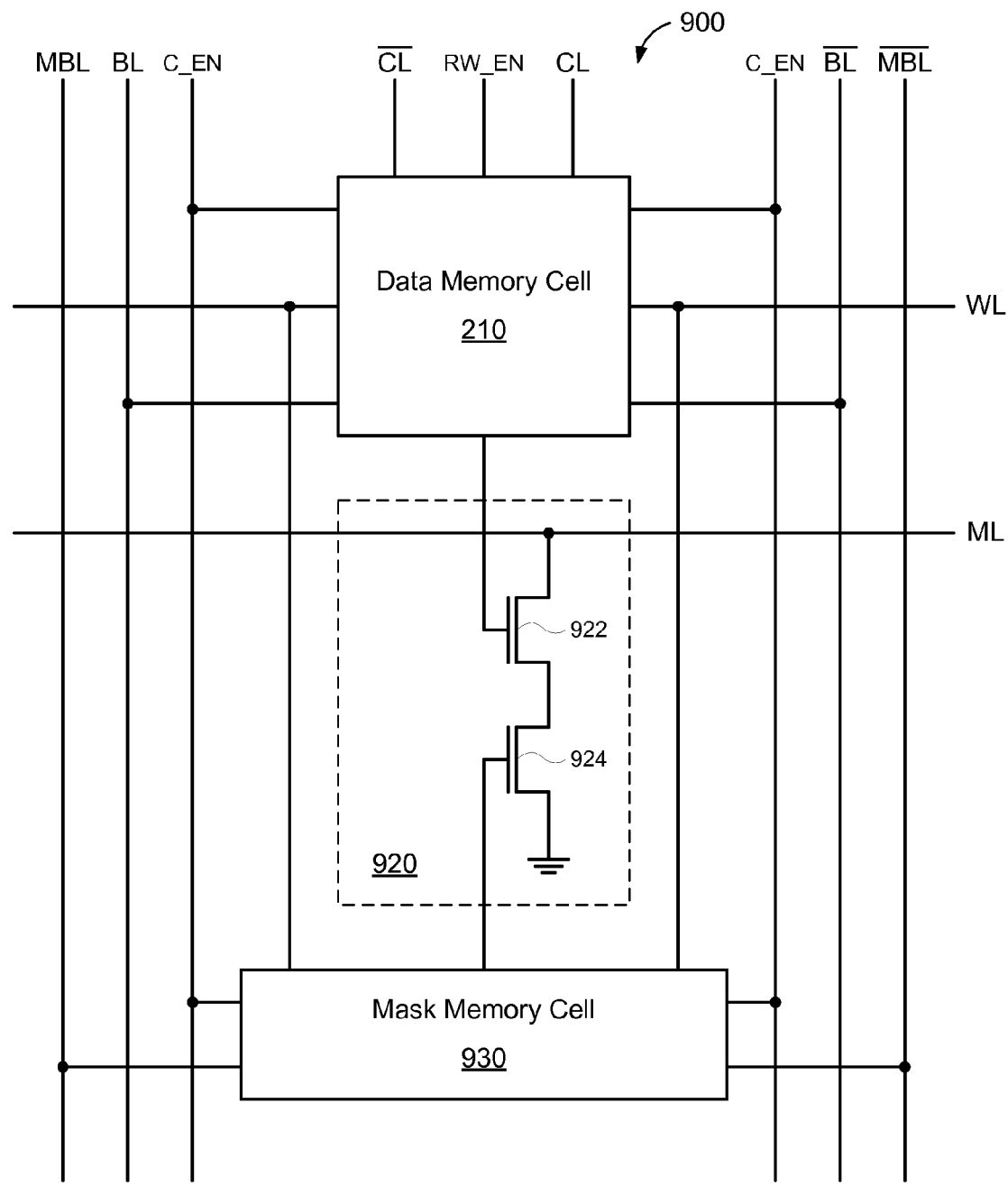
FIG. 9 shows a ternary STT-CAM cell in accordance with some embodiments.

FIG. 9 illustrates a ternary STT-CAM cell 900 in accordance with present embodiments. The ternary STT-CAM cell 900 includes STT memory cell 210, a compare circuit 920, and a mask memory cell 930. The memory cell 210 is connected to read/write enable line RW_EN, word line WL, complementary bit lines BL and $\overline{BL}$, complementary compare lines CL and $\overline{CL}$, and the compare enable lines C_EN in the manner described above with respect to FIG. 2B. For some embodiments, memory cell 210 may be coupled two separate word lines WLA and WLB, for example, in the manner described above with respect to FIG. 8.

The mask memory cell 930 stores a mask bit that indicates a "mask" state for the STT-CAM cell 900. For some embodiments, the mask memory cell 930 is an STT-based memory cell (e.g., similar to memory cell 210). For other embodiments, the mask memory cell 930 can be implemented as a RAM-based memory cell (e.g., SRAM or DRAM). Data is written to the mask memory cell 930 by activating the word line WL (or word lines WLA and WLB) and applying a corresponding differential voltage across the mask bit lines MBL and $\overline{MBL}$, for example, in a manner similar to the write operations described above with respect to FIGS. 3A-3C. For example, storing a logic low "0" mask bit in the masked memory cell 930 places the STT-CAM cell 900 in a masked state, and storing a logic high "1" mask bit in the masked memory cell 930 places the STT-CAM cell 900 in an unmasked state.

The compare circuit 920 includes two match transistors 922 and 924. The first match transistor 922 detects the match results from a comparison between data stored in memory cell 910 with the comparand data applied to the CAM cell via CL/$\overline{CL}$. The second match transistor 924 is selectively enabled in response to the mask bit stored in the mask memory cell 930. Thus, because the compare circuit 920 will discharge the match line ML to ground potential only if both match transistors 922 and 924 are turned on, storing a logic low mask bit in the mask memory cell 930 maintains match transistor 924 in a non-conductive state, thereby forcing a match condition by preventing compare circuit 920 from discharging the match line ML low toward ground potential. In this manner, compare operations in ternary STT-CAM cell 900 are masked by the logic low mask bit.

During compare operations, the compare enable lines C_EN may selectively connect the mask bit lines MBL and $\overline{MBL}$ to the mask memory cell 930. A mask compare current $I_{MC}$ may then be driven from the mask bit line MBL through the mask memory cell 930 to the complementary mask bit line $\overline{MBL}$, or vice-versa, to enable the match transistor 924 to determine the mask bit stored in the mask memory cell 930. Preferably, the mask compare current $I_{MC}$ is less than a mask write current $I_{MW}$ used to write data to the mask memory cell 930. For other embodiments, the compare enable lines C_EN may selectively connect the compare lines CL and $\overline{CL}$ to the mask memory cell 930 to enable the match transistor 924 to determine the mask bit stored in the mask memory cell 930 based on a read current $I_C$.

Figure 10A:
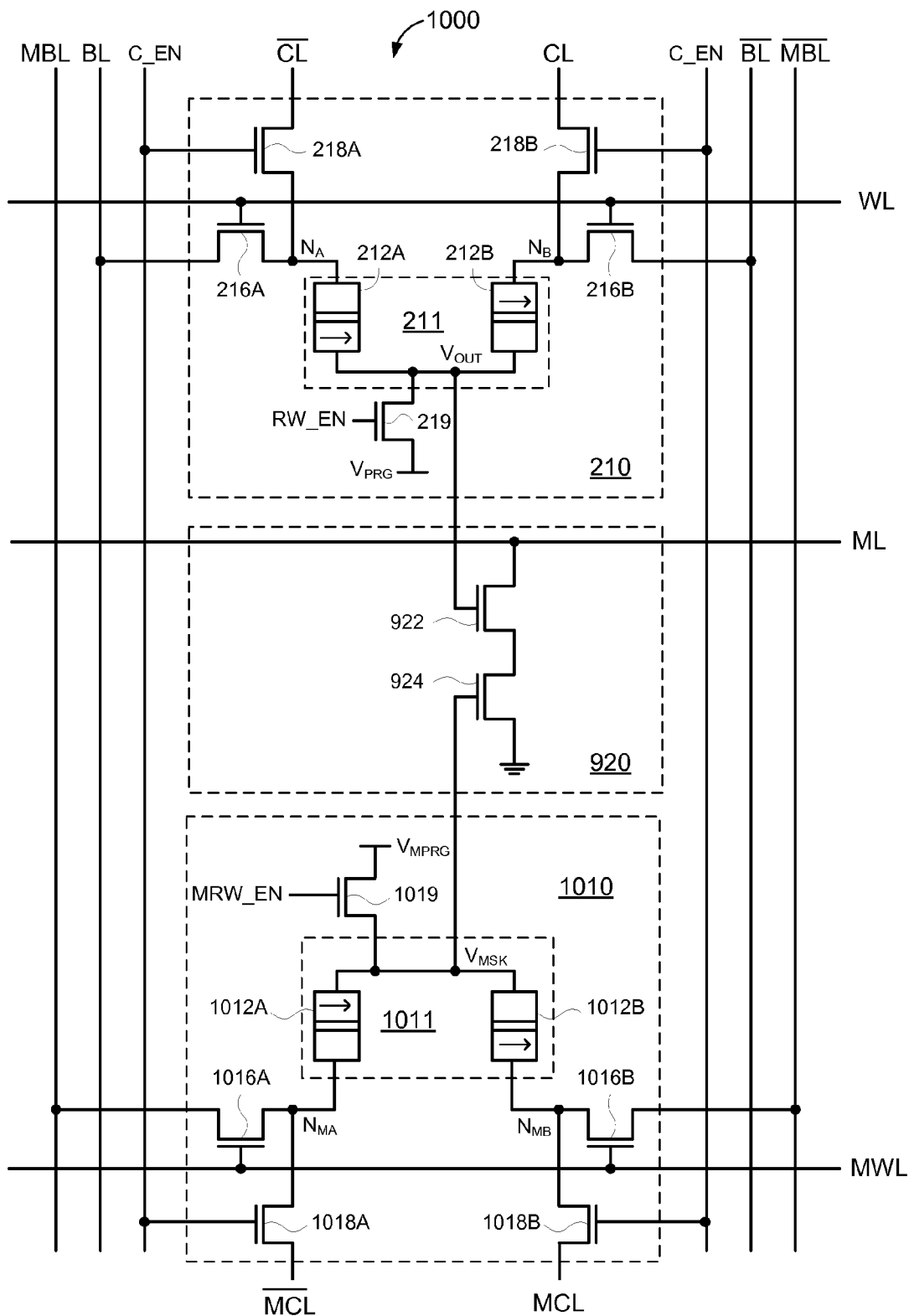
FIG. 10A shows one embodiment of the ternary STT-CAM cell of FIG. 9.

FIG. 10A illustrates a ternary STT-CAM cell 1000 that is one embodiment of ternary STT-CAM cell 900 of FIG. 9. The ternary STT-CAM cell 1000 includes STT memory cell 210, compare circuit 920, and an STT mask memory cell 1010. The configuration and operation of mask memory cell 210 is similar to that described above with respect to FIGS. 2B, 3A-3C, 4, and 5A-5E, and is thus not repeated again here. The configuration and operation of compare circuit 920 is similar to that described above with respect to FIG. 9, and is thus not repeated again here. Mask memory cell 1010, which is one embodiment of mask memory cell 930 of FIG. 9, stores a mask bit that selectively masks compare operations in STT-CAM cell 1000. For example, when the mask bit is a logic "1," compare operations are performed in normal (e.g., unmasked) manner similar to that described above with respect to FIGS. 2B and 5A-5E. Conversely, when the mask bit is a logic "0," a match condition is forced during compare operations in ternary STT-CAM cell 1000, thereby allowing the ternary STT-CAM cell 1000 to store a ternary "don't care" state in which the compare operation is masked.

More specifically, mask memory cell 1010 includes an STT mask storage cell 1011, access transistors 1016A-1016B, mask compare enable transistors 1018A-1018B, and a mask read/write enable transistor 1019. The mask storage cell 1011 includes two MTJ elements 1012A-1012B that together store a mask bit. The first MTJ element 1012A is connected between a first input node $N_{MA}$ and an output node $V_{MSK}$ of the mask storage cell 1011, and the second MTJ element 1012B is connected between a second input node $N_{MB}$ and mask output node $V_{MSK}$. Access transistor 1016A is connected between MTJ element 1012A and mask bit line MBL, and access transistor 1016B is connected between MTJ element 1012B and the complementary mask bit line $\overline{MBL}$. The gates of access transistors 1016A and 1016B are connected to a mask word line MWL. When asserted (e.g., to logic high), the mask word line MWL turns on access transistors 1016A-1016B to allow mask data to be written to and/or read from the mask storage cell 1011 via the mask bit lines MBL and $\overline{MBL}$. When de-asserted (e.g., to logic low), the mask word line MWL turns off access transistors 1016A-1016B to isolate mask storage cell 1011 from the mask bit lines. For other embodiments, the gates of access transistors 216A and 216B can be connected to separate word lines WL, for example, in a manner similar to that described above with respect to FIG. 8, and/or the gates of access transistors 1016A and 1016B can be connected to separate mask word lines MWL.

A complementary mask compare line $\overline{MCL}$ is connected to the MJT element 1012A at node $N_{MA}$ via the first mask compare enable transistor 1018A, and the a mask compare line MCL is connected to the MTJ element 1012B at node $N_{MB}$ via the second mask compare enable transistor 1018B. The gates of the mask compare enable transistors 1018A and 1018B are connected to compare enable lines C_EN. For simplicity, the compare lines CL/$\overline{CL}$ and MCL/$\overline{MCL}$ are shown as being connected only to the ternary STT-CAM cell 1000 shown in FIG. 10A. However, for embodiments including an array having a plurality of rows of ternary STT-CAM cells 1000, each set of complementary compare line pairs CL/$\overline{CL}$ and MCL/$\overline{MCL}$ extends across the rows (i.e., along the columns) of the array and are coupled to a similarly positioned ternary STT-CAM cell 1000 in each row.

The mask read/write enable transistor 1019 is connected between the output node $V_{MSK}$ of the mask storage cell 1011 and an adjustable mask program voltage $V_{MPRG}$, and has a gate coupled to a mask read/write signal line MRW_EN. The signal MRW_EN is driven to a logic high state during read and write operations to couple mask output node $V_{MSK}$ to $V_{MPRG}$, and is driven to a logic low state during compare operations to isolate node $V_{MSK}$ from $V_{MPRG}$. The adjustable mask program voltage $V_{MPRG}$ can be set to any desired voltage to facilitate programming STT mask storage cell 1011 to desired logic states and/or to implement read operations for STT mask storage cell 1011.

The mask storage cell 1010 stores a mask bit (MSK) in a differential manner according to the relative resistances RMA and RMB of MTJ elements 1012A and 1012B, respectively, in a manner similar to that described above with respect to data storage cell 211. Thus, MTJ elements 1012A and 1012B form a programmable voltage divider circuit that generates the mask output voltage $V_{MSK}$ indicative of the logic state of the mask bit stored therein, where $$Vmsk = VDD\frac{RMA}{RMA + RMB}.$$

The magnitude of $V_{MSK}$ can be compared to a reference voltage ($V_{REF}$) to determine the logic state of MSK, for example, where $V_{MSK}<V_{REF}$ indicates MSK=0 and $V_{MSK}>V_{REF}$ indicates MSK=1.

More specifically, for some embodiments, the STT mask storage cell 1011 can be programmed to store MSK=0 by configuring MTJ element 1012A to have a relatively low resistance (RMA=RL) and configuring MTJ element 1012B to have a relatively high resistance (RMB=RH) so that the mask storage cell 1011 generates a relatively low value of $$Vmsk = VDD\frac{RL}{RL + RH} < V_{REF}.$$

Conversely, STT mask storage cell 1011 can be programmed to store MSK=1 by configuring MTJ element 1012A to have a relatively high resistance (RMA=RH) and configuring MTJ element 1012B to have a relatively low resistance (RMB=RL) so that the storage cell generates a relatively high value of $$Vmsk = VDD\frac{RH}{RL + RH} > V_{REF}.$$

Write operations to STT mask storage cell 1011 are performed in a manner similar to write operations to STT data storage cell 211 described above, and thus are not described again.

For exemplary embodiments described herein, VDD=1.2 volts, VH≈VDD, VL≈GND, RL≈3000Ω, and RH≈8000Ω. Thus, for such embodiments, configuring MTJ elements 1012A-1012B to store MSK=0 generates $$Vmsk = VDD\frac{RL}{RL + RH} \approx (1.2)\frac{8}{3+8} \approx 0.87$$

volts, and configuring MTJ elements 1012A-1012B B to store MSK=1 generates $$Vmsk = VDD\frac{RL}{RL + RH} \approx (1.2)\frac{3}{3+8} \approx 0.33$$

volts. Of course, for other embodiments, other suitable values for VDD, VH, VL, RH, and RL may be used.

During compare operations, signals RW_EN and MRW_EN are de-asserted (e.g., to logic low) to isolate data storage cell 211 from $V_{PRG}$ and to isolate mask storage cell 1011 from $V_{MPRG}$, respectively, and the word line WL and mask word line MWL are de-asserted (e.g., to logic low). Then, the compare enable lines C_EN are asserted (e.g., to logic high) and the mask compare lines $\overline{MCL}$ and MCL are driven to opposite states (e.g., VDD and ground potential, respectively), thereby enabling a mask compare current $I_{MC}$ to be driven from $\overline{MCL}$ through MJT elements 1012A-1012B to MCL. The mask compare current $I_{MC}$ generates the mask output voltage $V_{MSK}$ in response to the mask bit stored in mask storage cell 1011 (e.g., in response to the orientation and thus the relative resistances of MJT elements 1012A and 1012B). Note that the direction of the mask compare current $I_{MC}$ is always the same, regardless of whether the mask storage cell 1011 stores a logic "0" mask bit or a logic "1" mask bit (e.g., by biasing $\overline{MCL}$ to VDD and biasing MCL to VSS during compare operations). In this manner, the value of $V_{MSK}$ changes only in response to the mask value stored in mask storage cell 1011.

For example, if the mask storage cell 1011 stores a logic low mask bit MSK=0, which indicates a masked state for ternary STT-CAM cell 1000, the mask current $I_{MC}$ generates a value of $V_{MSK}<V_T$, thereby maintaining second match transistor 924 in a non-conductive state and preventing compare circuit 920 from discharging the match line ML. In this manner, the relatively low value of $V_{MSK}$ corresponding to MSK=0 masks the compare operation to force a match condition for ternary STT-CAM cell 1000, irrespective of the CAM data and/or comparand data. Conversely, if the mask storage cell 1011 stores a logic high mask bit MSK=1, which indicates an unmasked state for ternary STT-CAM cell 1000, the mask current $I_{MC}$ generates a value of $V_{MSK}>V_T$, thereby turning on second match transistor 924 and allowing comparison of the data bit stored in data storage cell 211 and the comparand bit to selectively turn on first match transistor 922 and discharge the match line ML. In this manner, the relatively high value of $V_{MSK}$ corresponding to MSK=1 does not mask the compare operation in ternary STT-CAM cell 1000.

A listing of the possible mask states for the ternary STT-CAM cell 1000 of FIG. 10A are shown below in Table 3:

TABLE 3

| MCL | $\overline{MCL}$ | RMA | MTJ 1012A Spin | RMB | MTJ 1012B Spin | MSK | Match State |
|---|---|---|---|---|---|---|---|
| VSS | VDD | LOW | parallel | HIGH | anti-parallel | masked | HIT |
| VSS | VDD | HIGH | anti-parallel | LOW | parallel | unmasked | HIT/ NO HIT |

Of course, for other embodiments, the mask compare lines MCL and $\overline{CL}$ can be biased to VDD and VSS, respectively, to induce a mask compare current $I_{MC}$ having an opposite polarity. Note that mask compare enable transistors 1018A and 1018B ensure that compare operations are performed independently of mask read and write operations. For one embodiment, mask compare enable transistors 1018A and 1018B are sized relative to the sizes (e.g., channel widths and/or lengths) of access transistors 1016A and 1016B so that the mask compare current $I_{MC}$ is less than the mask write current $I_{MW}$, thereby preventing write disturb during compare operations.

Figure 10B:
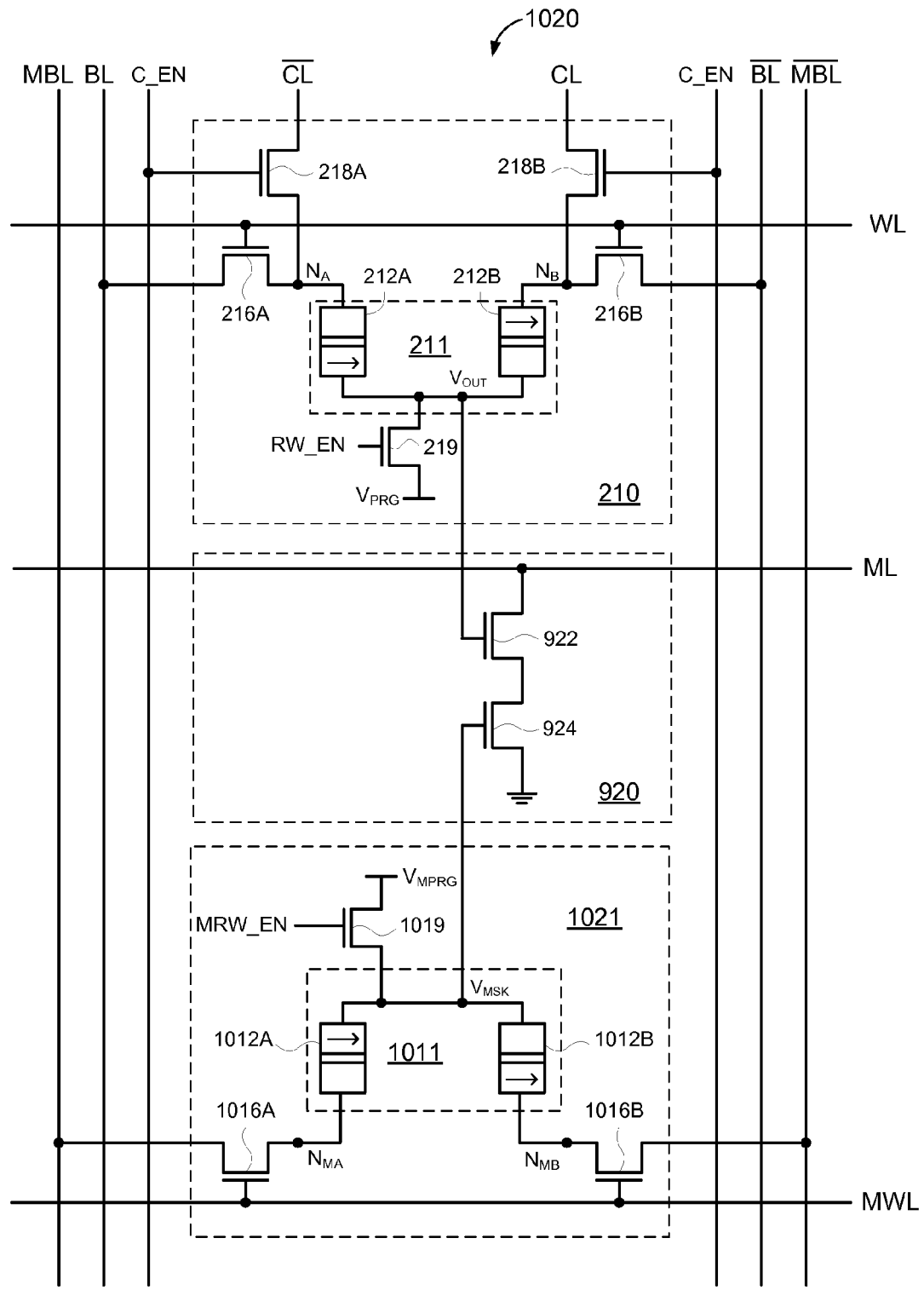
FIG. 10B shows another embodiment of the ternary STT-CAM cell of FIG. 9.

FIG. 10B shows a ternary STT-CAM cell 1020 in accordance with other embodiments. Ternary STT-CAM cell 1020 is similar to ternary STT-CAM cell 1000 of FIG. 10A, except that the mask compare enable transistors 1018A-1018B and mask compare lines MCL and $\overline{MCL}$ are eliminated, thereby reducing circuit area. For the embodiment of FIG. 10B, the mask compare current $I_{MC}$ used to generate the mask output voltage $V_{MSK}$ during compare operations can be provided to mask storage cell 1021 by asserting (e.g., to logic high) the mask word line MWL to turn on access transistors 1016A-1016B and by driving mask bit lines MBL and $\overline{MBL}$ to opposite states (e.g., to VDD and VSS, respectively), thereby inducing the mask compare current $I_{MC}$ to flow from MBL through MTJ elements 1012A and 1012B to $\overline{MBL}$. For such embodiments in which the mask compare enable transistors are eliminated, a well-known current limiting circuit (not shown for simplicity) coupled to the mask bit lines MBL and $\overline{MBL}$ can be selectively enabled during compare operations to ensure that the mask compare current $I_{MC}$ provided to STT mask storage cell 1021 during compare operations is less than the minimum mask write current $I_{MW}$ necessary to change the orientations of the ferromagnetic layers of MTJ elements 1012A-1012B, thereby preventing write disturb problems during compare operations.

For other embodiments, the gates of access transistors 216A and 216B can be connected to separate word lines WL, for example, in a manner similar to that described above with respect to FIG. 8, and/or the gates of access transistors 1016A and 1016B can be connected to separate mask word lines MWL.

Figure 10C:
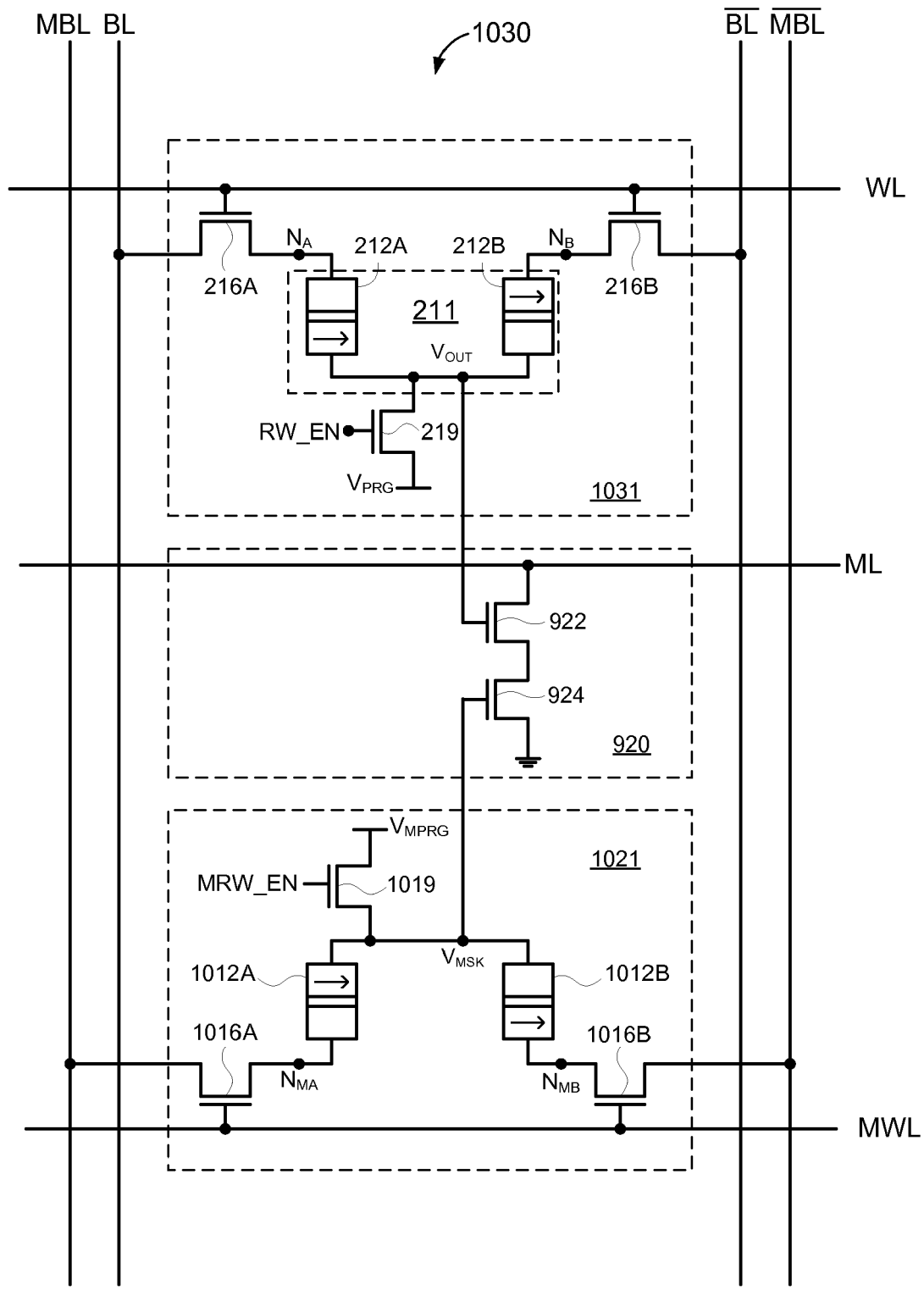
FIG. 10C shows yet another embodiment of the ternary STT-CAM cell of FIG. 9.

FIG. 10C shows a ternary STT-CAM cell 1030 in accordance with other embodiments. Ternary STT-CAM cell 1030 is similar to ternary STT-CAM cell 1020 of FIG. 10B, except that the compare enable transistors 218A-218B and compare enable signal line C_EN are eliminated, thereby further reducing circuit area. For the embodiment of FIG. 10C, the compare current $I_C$ is provided to STT storage cell 211 by asserting (e.g., to logic high) the word line WL to turn on access transistors 216A-216B, and then biasing the complementary bit lines BL and $\overline{BL}$ to opposite logic levels, depending upon the comparand data. For example, to provide a logic "0" compare bit, BL is driven to VH=VDD and $\overline{BL}$ is driven to VL=VSS so that $I_C$ flows from BL through MTJ elements 212A and 212B to $\overline{BL}$. Conversely, to provide a logic "1" compare bit, BL is driven to VL=VSS and $\overline{BL}$ is driven to VH=VDD so that $I_C$ flows from $\overline{BL}$ through MTJ elements 212B and 212A to BL.

For embodiments in which the compare enable transistors are eliminated, a well-known current limiting circuit (not shown for simplicity) coupled to the bit lines BL and $\overline{BL}$ can be selectively enabled during compare operations to ensure that the compare current $I_C$ provided to STT storage cell 211 during compare operations is less than the minimum write current $I_W$ necessary to change the orientations of the ferromagnetic layers of MTJ elements 212A-212B, thereby preventing write disturb problems during compare operations.

For other embodiments, the gates of access transistors 216A and 216B can be connected to separate word lines WL, for example, in a manner similar to that described above with respect to FIG. 8, and/or the gates of access transistors 1016A and 1016B can be connected to separate mask word lines MWL.

Figure 11A:
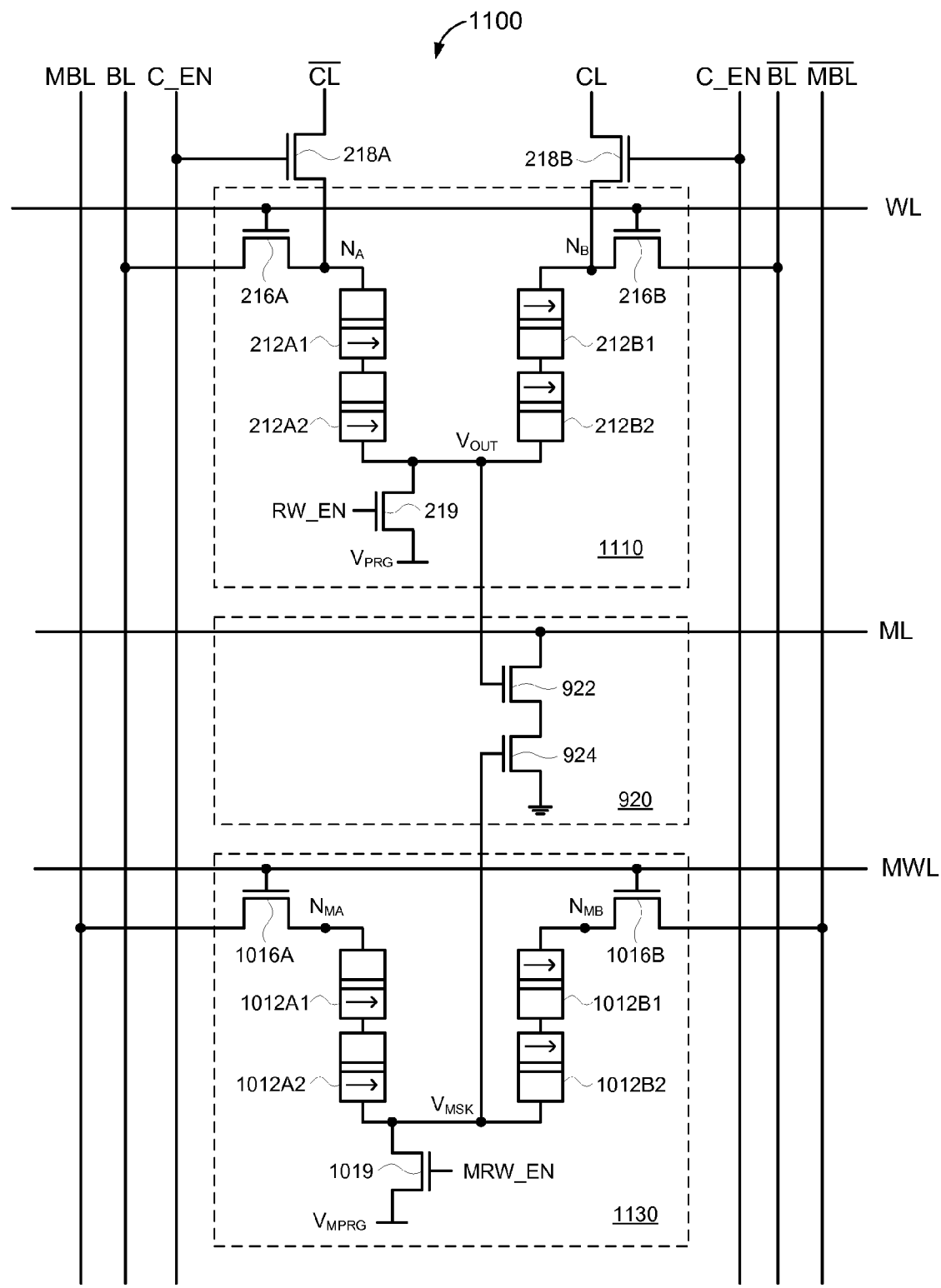
FIG. 11A shows one embodiment of the ternary STT-CAM cell of FIG. 9 having stacked MTJ elements.

FIG. 11A shows a ternary STT-CAM cell 1100 employing storage cells having stacked MTJ elements in accordance with some embodiments. For example, ternary STT-CAM cell 1100 is similar to ternary STT-CAM cell 1020 of FIG. 10B, except that STT-CAM cell 1100 includes an STT data storage cell 1110 having stacked MTJ elements and includes an STT mask storage cell 1130 having stacked MTJ elements. More specifically, data storage cell 1110 includes 2 MTJ elements 212A1-212A2 connected in series between nodes $N_A$ and $V_{OUT}$, and includes 2 MTJ elements 212B1-212B2 connected in series between nodes $N_B$ and $V_{OUT}$. Similarly, mask storage cell 1130 includes 2 MTJ elements 1012A1-1012A2 connected in series between nodes $N_{MA}$ and $V_{MSK}$, and includes 2 MTJ elements 1012B1-1012B2 connected in series between nodes $N_{MB}$ and $V_{MSK}$. For other embodiments, STT storage cells 1110 and 1130 may have other numbers of stacked MTJ elements.

By including stacks of MTJ elements 212A1-212A2 and 212B1-212B2, STT storage cell 1110 can store 2 bits of data by configuring the MTJ elements 212A1-212A2 and 212B1-212B2 to have various resistances. More specifically, for the exemplary embodiment of FIG. 11A, the output voltage $V_{OUT}$ is given by the expression $$V_{OUT} = VDD \frac{RA1 + RA2}{RA1 + RA2 + RB1 + RB2},$$

where RA1 is the resistance of MTJ element 212A1, RA2 is the resistance of MTJ element 212A2, RB1 is the resistance of MTJ element 212B1, and RB2 is the resistance of MTJ element 212B2. An exemplary configuration of MTJ elements 212A1-212A2 and 212B1-212B2 to represent 2 data bits having four different data values is listed below in Table 4:

TABLE 4

| Data Bits | RA1  | RA2  | RB1  | RB2  |
|-----------|------|------|------|------|
| 00        | LOW  | LOW  | HIGH | HIGH |
| 01        | LOW  | HIGH | HIGH | HIGH |
| 10        | HIGH | HIGH | LOW  | HIGH |
| 11        | HIGH | HIGH | LOW  | LOW  |

Of course, the mapping between data values and the relative resistances of the MTJ elements 212A1-212A2 and 212B1-212B2 listed in Table 4 is merely illustrative, and can be modified as desired. In addition to representing multiple bits of data, including stacks of MTJ elements in STT storage cell 1110 can also be used to more effectively optimize the tunneling magneto resistance ratio with less impact on area, for example, as compared to embodiments that do not include stacks of MTJ elements.

The MTJ elements 1012A1-1012A2 and 1012B1-1012B2 of mask storage cell 1130 can be selectively configured in a similar manner to represent multiple mask bits. Read, write, and compare operations of ternary STT-CAM cell 1100 are performed in a manner similar to that described above with respect to ternary STT-CAM cell 1020 of FIG. 10B.

For other embodiments, the gates of access transistors 216A and 216B can be connected to separate word lines WL, for example, in a manner similar to that described above with respect to FIG. 8, and/or the gates of access transistors 1016A and 1016B can be connected to separate mask word lines MWL.

Figure 11B:
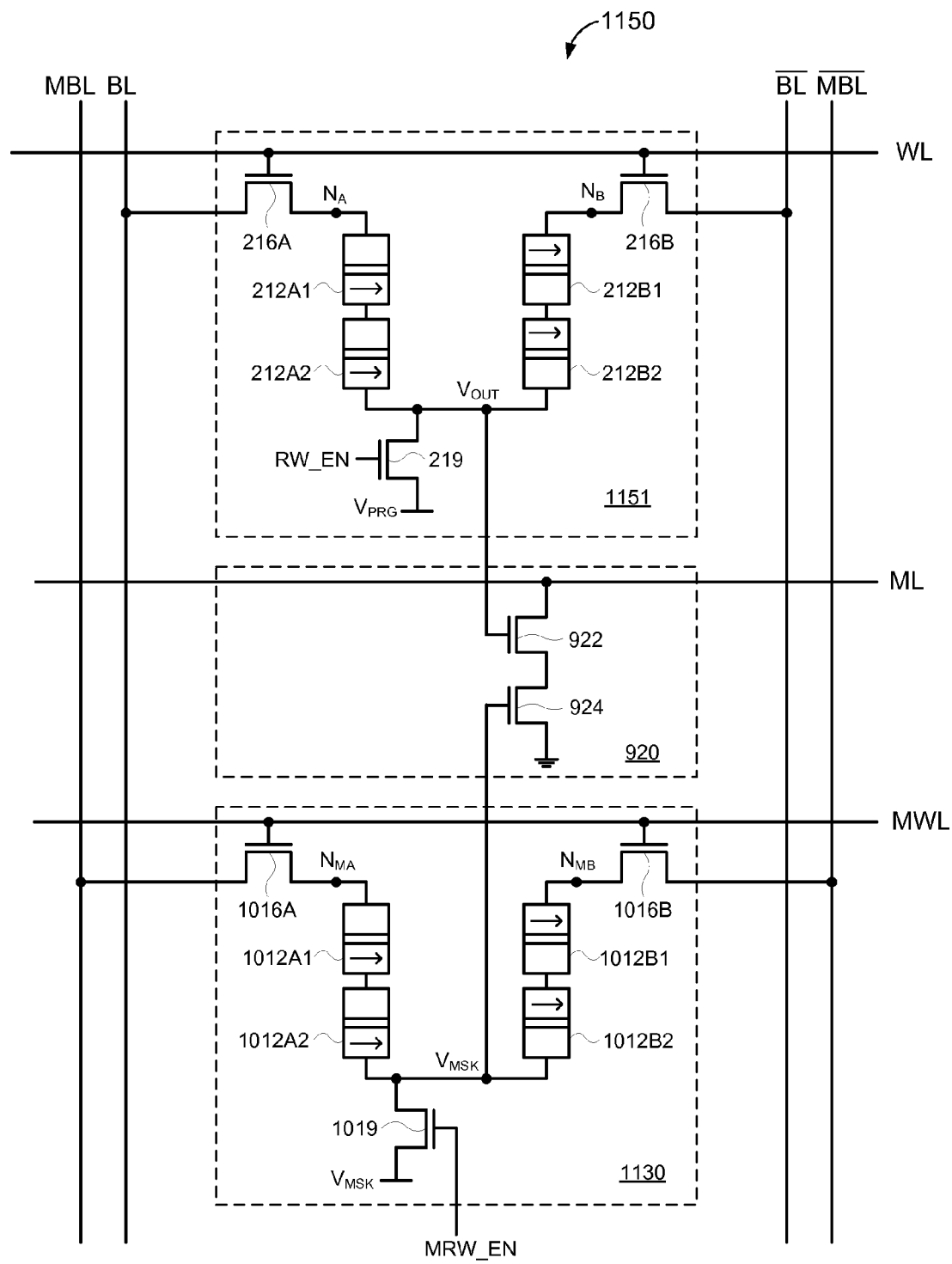
FIG. 11B shows another embodiment of the ternary STT-CAM cell of FIG. 9 having stacked MTJ elements.

FIG. 11B shows a ternary STT-CAM cell 1150 employing storage cells having stacked MTJ elements in accordance with other embodiments. For example, ternary STT-CAM cell 1150 is similar to ternary STT-CAM cell 1100 of FIG. 11A, except that STT-CAM cell 1150 does not include compare enable transistors 218A-218B, thereby reducing circuit size. Read, write, and compare operations of ternary STT-CAM cell 1150 are performed in a manner similar to those of ternary STT-CAM cell 1100 of FIG. 11A. For the embodiment of FIG. 11B, the compare current $I_C$ is provided to STT storage cell 1151 by asserting (e.g., to logic high) the word line WL to turn on access transistors 216A-216B, and then biasing the complementary bit lines BL and $\overline{BL}$ to opposite logic levels, depending upon the comparand data. For example, to provide a logic "0" compare bit, BL is driven to VH=VDD and $\overline{BL}$ is driven to VL=VSS so that $I_C$ flows from BL through MTJ elements 212A1-212A2 and 212B1-212B2 to $\overline{BL}$. Conversely, to provide a logic "1" compare bit, BL is driven to VL=VSS and $\overline{BL}$ is driven to VH=VDD so that $I_C$ flows from $\overline{BL}$ through MTJ elements 212B1-212B2 and 212A1-212A2 to $\overline{BL}$.

For embodiments in which the compare enable transistors are eliminated, a well-known current limiting circuit (not shown for simplicity) coupled to the bit lines BL and $\overline{BL}$ can be selectively enabled during compare operations to ensure that the compare current $I_C$ provided to STT storage cell 1151 during compare operations is less than the minimum write current $I_W$ necessary to change the orientations of the ferromagnetic layers of MTJ elements 212A-212B, thereby preventing write disturb problems during compare operations.

For other embodiments, the gates of access transistors 216A and 216B can be connected to separate word lines WL, for example, in a manner similar to that described above with respect to FIG. 8, and/or the gates of access transistors 1016A and 1016B can be connected to separate mask word lines MWL.

Figure 12A:
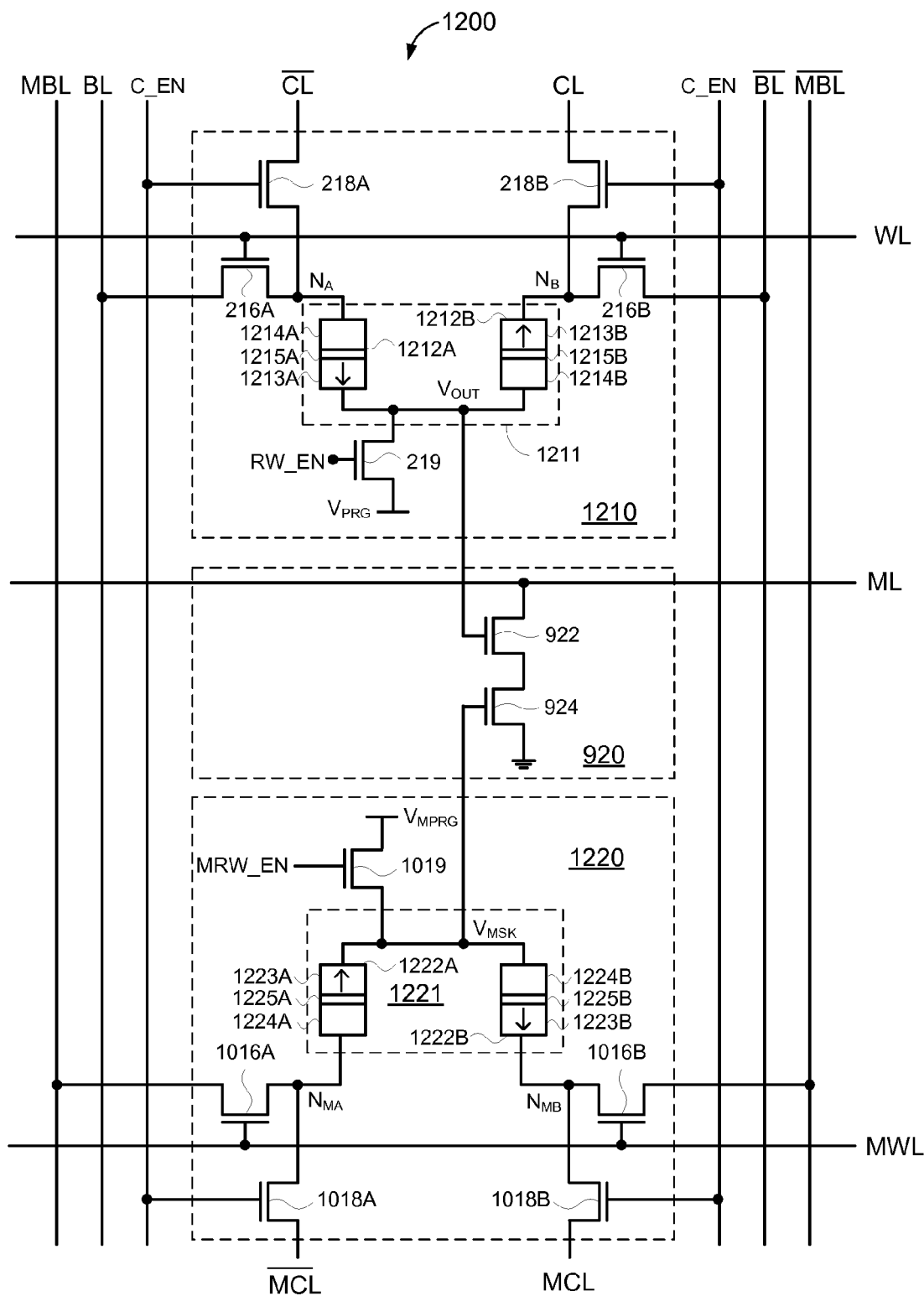
FIG. 12A shows one embodiment of the ternary STT-CAM cell of FIG. 9 employing MTJ elements having perpendicular magnetic anisotropy.

FIG. 12A illustrates a ternary STT-CAM cell 1200 that is another embodiment of ternary STT-CAM cell 900 of FIG. 9. The ternary STT-CAM cell 1200 includes an STT data memory cell 1210, compare circuit 920, and an STT mask memory cell 1220. The configuration and operation of memory cell 1210 is similar to that described above with respect to FIG. 10A, except that STT memory cell 1210 includes a storage cell 1211 having MTJ elements 1212A and 1212B characterized by perpendicular magnetic anisotropy, as compared to the parallel magnetic anisotropy characteristic of MTJ elements 212A and 212B of FIG. 10A.

Each MTJ element 1212 includes two ferromagnetic layers 1213-1214 separated by a thin layer of insulating material 1215. Orienting the magnetization directions of the ferromagnetic layers 1213-1214 of an MJT element 1212 in the same direction (e.g., to achieve parallel orientation) causes the MTJ element 1212 to have a relatively low resistance RL, and conversely, orienting the magnetization directions of the ferromagnetic layers 1213-1214 of the MJT element 1212 to opposite directions (e.g., to achieve anti-parallel orientation) causes the MTJ element 1212 to have a relatively high resistance RH, wherein RH>RL.

More specifically, the magnetization direction of the first ferromagnetic layer 1213 of each MTJ element 1212 is fixed to a predetermined magnetization direction that does not generally change, and thus the first ferromagnetic layer 1213 of each MTJ element 1212 is denoted as the fixed or pinned layer (e.g., as indicated by the arrows associated with layers 1213A and 1213B in FIG. 12A). The magnetization direction of the second ferromagnetic layer 1214 of each MTJ element 1212 is not fixed to a predetermined magnetization direction, but rather is free to change direction, and thus the second ferromagnetic layer 1214 of each MTJ element 1212 is denoted as the free layer (e.g., as indicated by the absence of arrows associated with layers 1214A and 1214B in FIG. 12A).

During a program operation, the MTJ elements 1212 can be programmed to a desired state via spin-torque transfer by driving a write current $I_W$ across their ferromagnetic layers 1213-1214. More specifically, the free ferromagnetic layer 1214 of each MTJ element 1212 can be oriented to be parallel with its corresponding pinned ferromagnetic layer 1213 (i.e. to achieve a relatively low resistance) by driving a current of a first polarity through the MTJ elements 1212, and conversely, the free ferromagnetic layer 1214 of each MTJ element 1212 can be oriented to be anti-parallel with its corresponding pinned ferromagnetic layer 1213 (i.e. to achieve a relatively high resistance) by driving a current of a second (e.g., opposite) polarity through the MTJ elements 1212. In this manner, the MTJ elements 1212A and 1212B of FIG. 12A form a voltage divider circuit that represents a data bit as an output voltage $V_{OUT}$ generated in response to application of a compare current $I_C$, for example, in a manner similar to that described above with respect to FIGS. 3A-3C, except that the orientations of MTJ elements 1212 are orthogonal to those of MTJ elements 212.

The configuration and operation of STT mask memory cell 1220 is similar to that described above with respect to STT mask storage cell 1010 of FIG. 10A, except that STT mask storage memory cell 1220 includes a storage cell 1221 having MTJ elements 1222A and 1222B that are characterized by perpendicular magnetic anisotropy, as compared to the parallel magnetic anisotropy characteristic of MTJ elements 1012A and 1012B of FIG. 10A.

Each MTJ element 1222 includes two ferromagnetic layers 1223-1224 separated by a thin layer of insulating material 1225. Orienting the magnetization directions of the ferromagnetic layers 1223-1224 of an MJT element 1222 in the same direction (e.g., to achieve parallel orientation) causes the MTJ element 1222 to have a relatively low resistance RL, and conversely, orienting the magnetization directions of the ferromagnetic layers 1223-1224 of the MJT element 1222 to opposite directions (e.g., to achieve anti-parallel orientation) causes the MTJ element 1222 to have a relatively high resistance RH, wherein RH>RL.

More specifically, the magnetization direction of the first ferromagnetic layer 1223 of each MTJ element 1222 is fixed to a predetermined magnetization direction that does not generally change, and thus the first ferromagnetic layer 1223 of each MTJ element 1222 is denoted as the fixed or pinned layer (e.g., as indicated by the arrows associated with layers 1223A and 1223B in FIG. 12A). The magnetization direction of the second ferromagnetic layer 1224 of each MTJ element 1222 is not fixed to a predetermined magnetization direction, but rather is free to change direction, and thus the second ferromagnetic layer 1224 of each MTJ element 1222 is denoted as the free layer (e.g., as indicated by the absence of arrows associated with layers 1224A and 1224B in FIG. 12A).

The configuration and operation of compare circuit 920 is similar to that described above with respect to FIG. 9, and is thus not repeated again here. Further, read, write, and compare operations of ternary STT-CAM cell 1200 are performed in a manner similar to that described above with respect to ternary STT-CAM cell 1000 of FIG. 10A.

For other embodiments, access transistors 216A-216B can be coupled to two separate word lines WL, for example, as described above with respect to FIG. 8, and/or access transistors 1016A-1016B can be connected to separate mask word lines MWL.

Figure 12B:
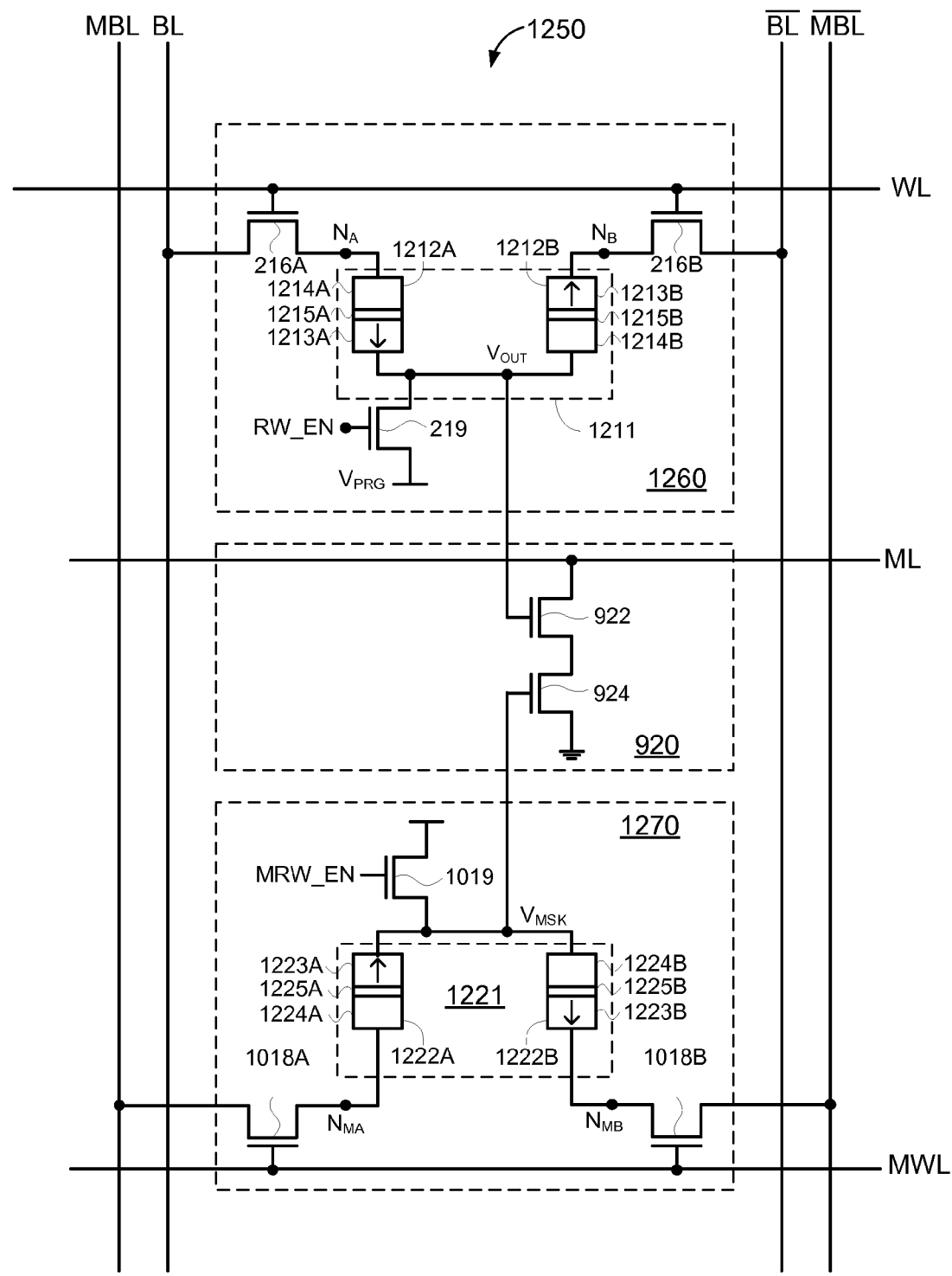
FIG. 12B shows another embodiment of the ternary STT-CAM cell of FIG. 9 employing MTJ elements having perpendicular magnetic anisotropy.

FIG. 12B shows a ternary STT-CAM cell 1250 in accordance with other embodiments. Ternary STT-CAM cell 1250 is similar to ternary STT-CAM cell 1200 of FIG. 12A, except that the compare enable transistors 21A-218B and compare enable signal line C_EN are eliminated, thereby further reducing circuit area. For the embodiment of FIG. 12A, the compare current $I_C$ is provided to STT storage cell 1211 by asserting (e.g., to logic high) the word line WL to turn on access transistors 216A-216B, and then biasing the complementary bit lines BL and $\overline{BL}$ to opposite logic levels, depending upon the comparand data. For example, to provide a logic "0" compare bit, BL is driven to VH=VDD and $\overline{BL}$ is driven to VL=VSS so that $I_C$ flows from BL through MTJ elements 1212A and 1212B to $\overline{BL}$. Conversely, to provide a logic "1" compare bit, BL is driven to VL=VSS and $\overline{BL}$ is driven to VH=VDD so that $I_C$ flows from $\overline{BL}$ through MTJ elements 1212B and 1212A to BL.

For embodiments in which the compare enable transistors are eliminated, a well-known current limiting circuit (not shown for simplicity) coupled to the bit lines BL and $\overline{BL}$ can be selectively enabled during compare operations to ensure that the compare current $I_C$ provided to STT storage cell 1211 during compare operations is less than the minimum write current $I_W$ necessary to change the orientations of the ferromagnetic layers of MTJ elements 1212A-1212B to prevent write disturb problems during compare operations. Similarly, a well-known current limiting circuit (not shown for simplicity) coupled to the mask bit lines MBL and $\overline{\text{MBL}}$ can be selectively enabled during compare operations to ensure that the mask compare current $I_{MC}$ provided to STT mask storage cell 1221 during compare operations is less than the minimum mask write current $I_{MW}$ necessary to change the orientations of the ferromagnetic layers of MTJ elements 1222A-1222B, thereby preventing write disturb problems during compare operations.

Figure 13:
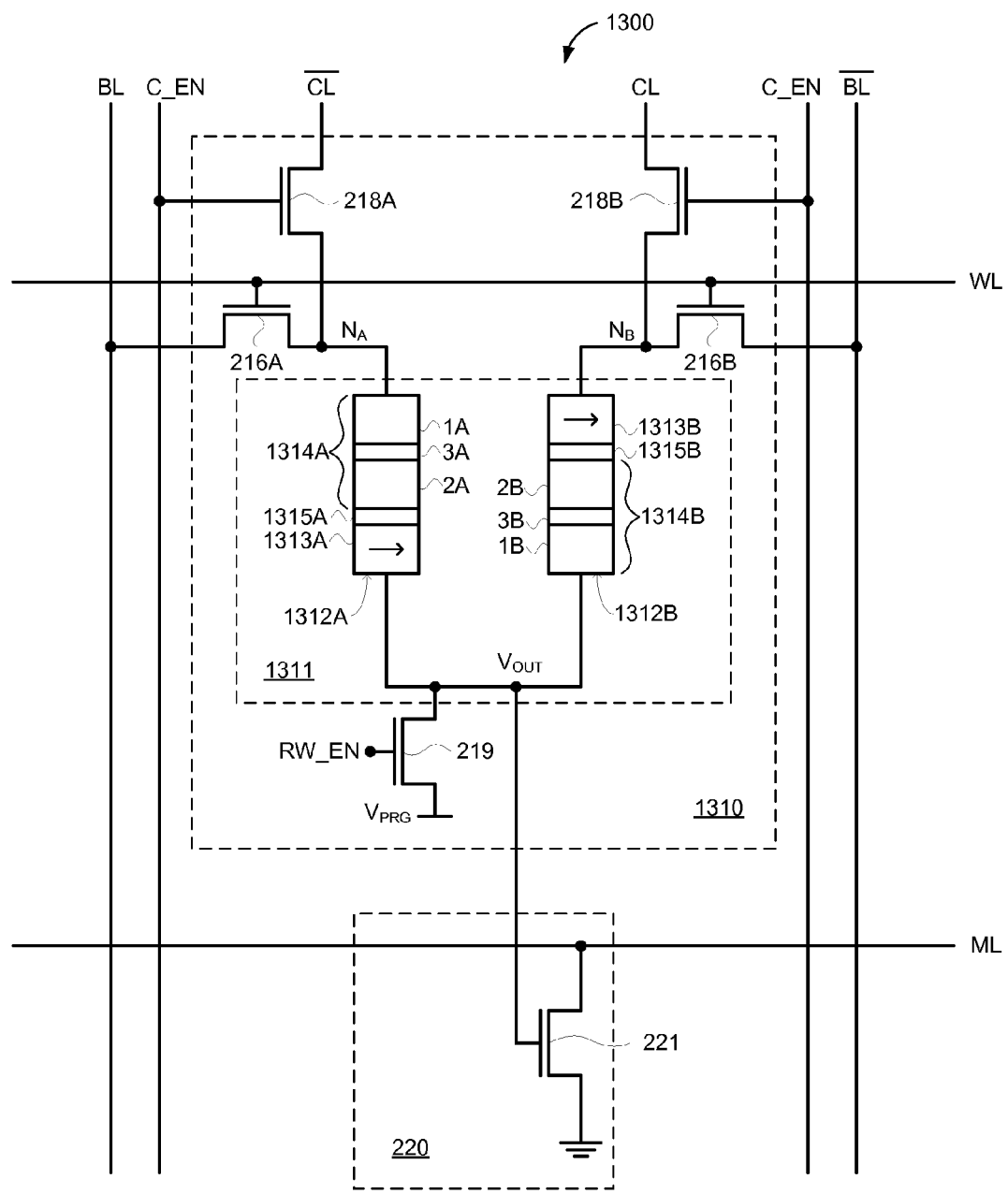
FIG. 13 shows a binary STT-CAM cell in accordance with other embodiments.

FIG. 13 shows a binary STT-CAM cell 1300 in accordance with other embodiments. Binary STT-CAM cell 1300 is similar to binary STT-CAM cell 200 of FIG. 2B, except that the STT-CAM cell 1300 includes an STT storage cell 1311 having Tunnel-Magnetoresistance (TMR) elements 1312A-1312B instead of MTJ elements. As shown in FIG. 13, each TMR element 1312 includes a pinned lower ferromagnetic layer 1313 separated from a free ferromagnetic layer 1314 by a tunnel barrier layer 1315. For some embodiments, tunnel barrier layer 1315 is made of Magnesium Oxide, although other suitable materials can be used. The free ferromagnetic layer 1314 is formed of first and second ferromagnetic layers 1 and 2 separated by a spacer layer 3 made of a suitable non-magnetic material. Because the free ferromagnetic layer 1314 of each TMR element 1312 is thicker than the free layers of the above-described MTJ elements, the free ferromagnetic layer 1314 is less susceptible to thermal agitation, thereby increasing data stability. Further, the insertion of the spacer layer 3 between the first and second free ferromagnetic layers 1 and 2 reduces the write current.

For other embodiments, compare enable transistors 218 can be eliminated, as described above. Further, although not shown for simplicity, a mask storage cell described with respect to various embodiments above can be added to STT-CAM cell 1300 to form a ternary STT-CAM cell.

It should be noted that the various integrated circuits, dice and packages disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be buses. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A content addressable memory (CAM) device, comprising:
   an array having a number of CAM rows, each row including a plurality of CAM cells coupled to a match line, wherein each CAM cell includes a spin-torque transfer (STT) storage cell for storing a data bit; and
   a priority encoder having inputs coupled to the match lines and having an output to generate an index of the matching row that has the highest priority, wherein each STT storage cell comprises:
   a first magnetic tunnel junction (MTJ) element coupled between a first input node and an output node of the STT storage cell;
   a second MTJ element coupled between a second input node and the output node of the STT storage cell, wherein the first and second input nodes are different; and
   a first match transistor connected between the match line and ground potential and having a gate directly connected to the output node, wherein the output node is directly connected to both the first and second MTJ elements.

2. The CAM device of claim 1, wherein the logic state of a data bit stored in each STT storage cell is represented by the relative resistances of a pair of associated magnetic tunnel junction (MTJ) elements.

3. The CAM device of claim 2, wherein:
   the STT storage cell represents a logic high data bit by configuring a first MTJ element to have a relatively low resistance and by configuring a second MTJ element to have a relatively high resistance; and the STT storage cell represents a logic low data bit by configuring the first MTJ element to have a relatively high resistance and by configuring the second MTJ element to have a relatively low resistance.

4. The CAM device of claim 3, wherein each MTJ element comprises:
a first ferromagnetic layer having a pinned magnetization direction;
a second ferromagnetic layer having a free magnetization direction; and
an insulating layer disposed between the first and second ferromagnetic layers.

5. The CAM device of claim 1, wherein each CAM cell further comprises:
a first compare enable transistor coupled between the first MTJ element and a compare line and having a gate to a receive a compare enable signal; and
a second compare enable transistor coupled between the second MTJ element and a complementary compare line and having a gate to a receive the compare enable signal.

6. The CAM device of claim 5, wherein during compare operations, the compare enable signal is asserted to turn on the compare enable transistors.

7. The CAM device of claim 1, wherein each CAM cell further comprises:
a first access transistor coupled between the first MTJ element and a bit line and having a gate coupled to a word line; and
a second access transistor coupled between the second MTJ element and a complementary bit line and having a gate coupled to the word line.

8. The CAM device of claim 1, wherein each CAM cell further comprises:
a write enable transistor coupled between the output node and a programmable voltage and having a gate to receive a read/write enable signal.

9. The CAM device of claim 1, wherein each CAM cell further comprises:
a mask memory cell for storing a mask bit that selectively masks compare operations in the CAM cell; and
a second match transistor connected in series between the first match transistor and ground potential, and having a gate to receive the mask bit.

10. The CAM device of claim 9, wherein the mask memory cell comprises an STT mask memory cell.

11. The CAM device of claim 10, wherein the STT mask memory cell comprises:
a third magnetic tunnel junction (MTJ) element coupled between a first input node and an output node of the STT mask memory cell;
a fourth MTJ element coupled between a second input node and the output node of the STT mask memory cell.

12. The CAM device of claim 11, wherein the STT mask memory cell further comprises:
a first mask compare enable transistor coupled between the third MTJ element and a mask compare line and having a gate to a receive a compare enable signal; and
a second mask compare enable transistor coupled between the fourth MTJ element and a complementary mask compare line and having a gate to receive the compare enable signal.

13. The CAM device of claim 11, wherein STT mask memory cell further comprises:

a third access transistor coupled between the third MTJ element and a mask bit line and having a gate coupled to a mask word line; and
a fourth access transistor coupled between the fourth MTJ element and a complementary mask bit line and having a gate coupled to the mask word line.

14. The CAM device of claim 10, wherein STT mask memory cell further comprises:
a mask write enable transistor coupled between the mask cell output node and a programmable mask voltage and having a gate to receive a mask read/write enable signal.

15. The CAM device of claim 1, wherein during compare operations between a compare bit and the data bit stored in a corresponding STT storage cell, a compare current flows through the first and second MJT elements of the STT storage cell to generate a match voltage at the output node.

16. The CAM device of claim 15, wherein the match voltage is a single-ended voltage indicative of a match result between the compare bit and the data bit.

17. The CAM device of claim 15, wherein a direction of the compare current indicates a value of the compare bit.

18. The CAM device of claim 1, wherein for one or more of the STT storage cells:
the first MTJ element comprises two MTJ elements connected in series; and
the second MTJ element comprises two MTJ elements connected in series.

19. The CAM device of claim 18, wherein the STT storage cell represents two or more data bits.

20. The CAM device of claim 18, wherein each CAM cell further comprises:
a first compare enable transistor coupled between the first MTJ element and a compare line and having a gate to a receive a compare enable signal; and
a second compare enable transistor coupled between the second MTJ element and a complementary compare line and having a gate to a receive the compare enable signal.

21. A content addressable memory (CAM) device, comprising:
an array having a number of CAM rows, each row including a plurality of CAM cells coupled to a match line, wherein each CAM cell includes a spin-torque transfer (STT) storage cell for storing a data bit;
a priority encoder having inputs coupled to the match lines and having an output to generate an index of the matching row that has the highest priority, wherein each STT storage cell comprises:
a first tunnel magnetoresistance (TMR) element coupled between a first input node and an output node of the STT storage cell;
a second TMR element coupled between a second input node and the output node of the STT storage cell, wherein the first and second input nodes are different; and
a first match transistor connected between the match line and ground potential and having a gate directly connected to the output node, wherein the output node is directly connected to both the first and second MTJ elements.

22. The CAM device of claim 21, wherein each CAM cell further comprises:
a first compare enable transistor coupled between the first TMR element and a compare line and having a gate to a receive a compare enable signal; and a second compare enable transistor coupled between the second TMR element and a complementary compare line and having a gate to a receive the compare enable signal.

23. A content addressable memory (CAM) cell including a spin-torque transfer (STT) storage cell, comprising:
a first magnetic tunnel junction (MTJ) element coupled between a first input node and an output node of the CAM cell;
a second MTJ element coupled between a second input node and the output node of the CAM cell, wherein the first and second input nodes are different; and
a first match transistor connected between the match line and ground potential and having a gate directly connected to the output node, wherein the output node is directly connected to both the first and second MTJ elements.

24. The CAM cell of claim 23, wherein the logic state of a data bit stored therein is represented by the relative resistances of the first and second MTJ elements.

25. The CAM cell of claim 23, further comprising:
a first compare enable transistor coupled between the first MTJ element and a compare line and having a gate to a receive a compare enable signal; and
a second compare enable transistor coupled between the second MTJ element and a complementary compare line and having a gate to a receive the compare enable signal.

26. The CAM cell of claim 25, further comprising:
a first access transistor coupled between the first MTJ element and a bit line and having a gate coupled to a word line;
a second access transistor coupled between the second MTJ element and a complementary bit line and having a gate coupled to the word line; and
a write enable transistor coupled between the output node and a programmable voltage and having a gate to receive a read/write enable signal.

27. The CAM cell of claim 25, wherein during compare operations, the compare enable signal is asserted to turn on the compare enable transistors.

28. The CAM cell of claim 25, wherein during compare operations between a compare bit and the data bit, a compare current flows through the first and second MJT elements to generate a match voltage at the output node.

29. The CAM cell of claim 28, wherein the match voltage is a single-ended voltage indicative of a match result between the compare bit and the data bit.

30. The CAM cell of claim 28, wherein the compare current is less than a write current necessary to change the relatively resistances of the first and second MTJ elements.

31. The CAM device of claim 28, wherein a direction of the compare current indicates a value of the compare bit.

32. The CAM cell of claim 31, wherein a logic low compare bit is provided to the CAM cell by biasing the compare line to a low voltage and biasing the complementary compare line to a high voltage, and a logic high compare bit is provided to the CAM cell by biasing the compare line to the high voltage and biasing the complementary compare line to the low voltage.

33. The CAM cell of claim 26, further comprising:
a mask memory cell for storing a mask bit that selectively masks compare operations in the CAM cell; and
a second match transistor connected in series between the first match transistor and ground potential, and having a gate to receive the mask bit.

34. The CAM cell of claim 33, wherein the mask memory cell comprises an STT mask memory cell.

35. The CAM cell of claim 34, wherein the STT mask memory cell comprises:
a third magnetic tunnel junction (MTJ) element coupled between a first input node and an output node of the STT mask memory cell; and
a fourth MTJ element coupled between a second input node and the output node of the STT mask memory cell.

36. The CAM cell of claim 35, wherein the STT mask memory cell further comprises:
a first mask compare enable transistor coupled between the third MTJ element and a mask compare line and having a gate to a receive the compare enable signal; and
a second mask compare enable transistor coupled between the fourth MTJ element and a complementary mask compare line and having a gate to a receive the compare enable signal.

37. The CAM cell of claim 36, wherein STT mask memory cell further comprises:
a third access transistor coupled between the third MTJ element and a mask bit line and having a gate coupled to a mask word line; and
a fourth access transistor coupled between the fourth MTJ element and a complementary mask bit line and having a gate coupled to the mask word line.

* * * * *